US00RE35921E

United States Patent [19]

Harlin et al.

[11] E Patent Number: Re. 35,921

[45] Reissued Date of Patent: Oct. 13, 1998

[54] DYNAMIC VIDEO RAM INCORPORATING SINGLE CLOCK RANDOM PORT CONTROL

[75] Inventors: Roy E. Harlin, Louisville; Richard A. Herrington, Fort Collins, both of Colo.

[73] Assignee: Matsushita Electric Industrial Co., Ltd., Kadoma, Japan

[21] Appl. No.: 287,147

[22] Filed: Aug. 8, 1994

Related U.S. Patent Documents

Reissue of:

[64] Patent No.: 5,142,637
Issued: Aug. 25, 1992
Appl. No.: 277,637
Filed: Nov. 29, 1988

[51] Int. Cl.[6] ..... G06F 12/00; G11C 7/00; G11C 11/34

[52] U.S. Cl. ..... 365/233; 365/230.01; 365/230.09; 345/507; 345/509; 345/515; 345/191; 345/516; 711/104; 711/105

[58] Field of Search ..... 365/230.01, 230.09, 365/233, 230.02–230.08, 189.01, 189.04, 219, 221; 345/189, 200, 185, 190–193, 28, 196, 507, 509, 515, 191, 516; 395/164, 162, 166, 401, 431, 432, 438, 481, 494; 711/104, 105

[56] References Cited

U.S. PATENT DOCUMENTS

| | | | |
|---|---|---|---|
| 3,996,559 | 12/1976 | Morrin et al. | 382/304 |
| 4,347,587 | 8/1982 | Rao | 365/230.09 |
| 4,435,792 | 3/1984 | Bechtolsheim | 365/189.02 |
| 4,496,944 | 1/1985 | Collmeyer et al. | 345/27 |
| 4,546,451 | 10/1985 | Bruce | 395/166 |

(List continued on next page.)

FOREIGN PATENT DOCUMENTS

| | | |
|---|---|---|
| 0197413 | 10/1986 | European Pat. Off. . |
| 3628286 | 2/1988 | Germany . |
| 58-166579 | 10/1983 | Japan . |
| 61-148692 | 7/1986 | Japan . |
| 61-289594 | 12/1986 | Japan . |
| 62-223891 | 10/1987 | Japan . |
| 63-034795 | 2/1988 | Japan . |
| 63-123142 | 5/1988 | Japan . |
| 1124193 | 5/1989 | Japan . |
| 2198266 | 6/1988 | United Kingdom . |
| WO8403970 | 10/1984 | WIPO . |

OTHER PUBLICATIONS

European Search Report dated Feb. 3, 1998 for Application No. 97101926.0.

European Search Report dated Jan. 8, 1998 for Application No. 97101929.4.

European Search Report dated Jan. 8, 1998 for Application No. 97101927.8.

European Search Report dated Jan. 8, 1998 for Application No. 97101930.2.

European Search Report dated Jan. 8, 1998 for Application No. 97109202.8.

European Search Report dated Jan. 8, 1998 for Application No. 97109208.5.

(List continued on next page.)

*Primary Examiner*—Paul V. Kulik

*Attorney, Agent, or Firm*—Renner, Otto, Boisselle & Sklar, P.L.L.

[57] ABSTRACT

An architecture for a single chip dynamic video random access memory using a single clock to operate the random port to perform refresh, memory address, and to control the internal circuitry for inputting data and addresses and for outputting data as well as modifying information in the memory circuit chip having internal circuitry for performing drawing or replacement rule logical operations on an addressed line of stored video information In the RAM and further having the write masking circuitry for modifying selected portions of the line of stored video Information between selected START and STOP bit locations within the like.

76 Claims, 13 Drawing Sheets

U.S. PATENT DOCUMENTS

| | | | |
|---|---|---|---|
| 4,608,669 | 8/1986 | Klara et al. | 365/233 |
| 4,644,502 | 2/1987 | Kawashima | 365/219 |
| 4,646,270 | 2/1987 | Voss | 365/189.02 |
| 4,649,511 | 3/1987 | Gdula | 395/433 |
| 4,663,735 | 5/1987 | Novak et al. | 345/190 |
| 4,665,495 | 5/1987 | Thaden | 345/185 |
| 4,688,197 | 8/1987 | Novak et al. | 365/189.12 |
| 4,689,741 | 8/1987 | Redwine et al. | 345/190 |
| 4,691,295 | 9/1987 | Erwin et al. | 345/188 |
| 4,695,834 | 9/1987 | Gojo et al. | 345/113 |
| 4,710,902 | 12/1987 | Pelley, III et al. | 365/222 |
| 4,712,190 | 12/1987 | Guglielmi et al. | 711/167 |
| 4,734,880 | 3/1988 | Collins | 395/432 |
| 4,740,921 | 4/1988 | Lewandowski et al. | 365/189.09 |
| 4,742,474 | 5/1988 | Knierim | 345/187 |
| 4,754,425 | 6/1988 | Bhadriraju | 365/222 |
| 4,755,810 | 7/1988 | Knierim | 345/200 |
| 4,779,223 | 10/1988 | Asai et al. | 395/846 |
| 4,800,530 | 1/1989 | Itoh et al. | 365/189.12 |
| 4,807,189 | 2/1989 | Pinkham et al. | 365/189.05 |
| 4,816,817 | 3/1989 | Herrington | 345/198 |
| 4,823,322 | 4/1989 | Miyatake et al. | 365/190 |
| 4,831,597 | 5/1989 | Fuse | 365/233 |
| 4,839,828 | 6/1989 | Elsner et al. | 395/135 |
| 4,860,248 | 8/1989 | Lumelsky | 395/163 |
| 4,862,150 | 8/1989 | Katsura et al. | 345/153 |
| 4,868,553 | 9/1989 | Kawamata | 345/130 |
| 4,870,563 | 9/1989 | Oguchi | 395/375 |
| 4,876,663 | 10/1989 | McCord | 345/197 |
| 4,882,687 | 11/1989 | Gordon | 395/135 |
| 4,893,116 | 1/1990 | Henderson et al. | 345/133 |
| 4,897,818 | 1/1990 | Redwine et al. | 365/221 |
| 4,933,900 | 6/1990 | Yamaguchi et al. | 365/189.03 |
| 4,947,373 | 8/1990 | Yamaguchi et al. | 365/189.04 |
| 4,958,146 | 9/1990 | Priem et al. | 345/114 |
| 4,967,392 | 10/1990 | Werner et al. | 395/164 |
| 4,985,848 | 1/1991 | Pfeiffer et al. | 395/164 |
| 4,988,985 | 1/1991 | Barkans et al. | 345/187 |
| 5,036,475 | 7/1991 | Ueda | 395/164 |
| 5,056,044 | 10/1991 | Frederickson et al. | 395/164 |
| 5,077,693 | 12/1991 | Hardee et al. | 365/230.08 |
| 5,083,296 | 1/1992 | Hara et al. | 365/230.02 |
| 5,148,523 | 9/1992 | Harlin et al. | 395/164 |
| 5,148,524 | 9/1992 | Harlin et al. | 395/166 |
| 5,226,147 | 7/1993 | Fujishima et al. | 711/118 |
| 5,353,427 | 10/1994 | Fujishima et al. | 711/118 |
| 5,588,130 | 12/1996 | Fujishima et al. | 711/118 |

OTHER PUBLICATIONS

Journal of Electronic Engineering, (1987) No. 251, Tokyo, Japan, "Video RAM Chips Designed for Computer Graphics" by Masayoshi Nakane, Kaoru Tokushige, pp. 28–31.

Target Specification of the Hitachi, HM53462 Multi Port DRAM–Jun. 7, 1985.

Curtis, "Silicon Compilation: The Future is Now", IEEE potentials, May, 1986, vol. 5, No. 2, pp. 27–29.

Motorola Semiconductor Technical Data, MCM514256A, 1988.

Motorola Semiconductor Technical Data MCM6605A, Semiconductor Data Library, vol. 7/Series A, 1975.

Motorola Semiconductor Technical Data MCM6616L, Semiconductor Data Library, vol. 7/Series A, 1975.

U.S. Reissue Patent Application Serial No. 08/306,180, filed Sep. 14, 1994.

Examination Report for European App. No. 94116990.6, Mar. 8, 1996.

Examination Report for European App. No. 94116991.4, Mar. 8, 1996.

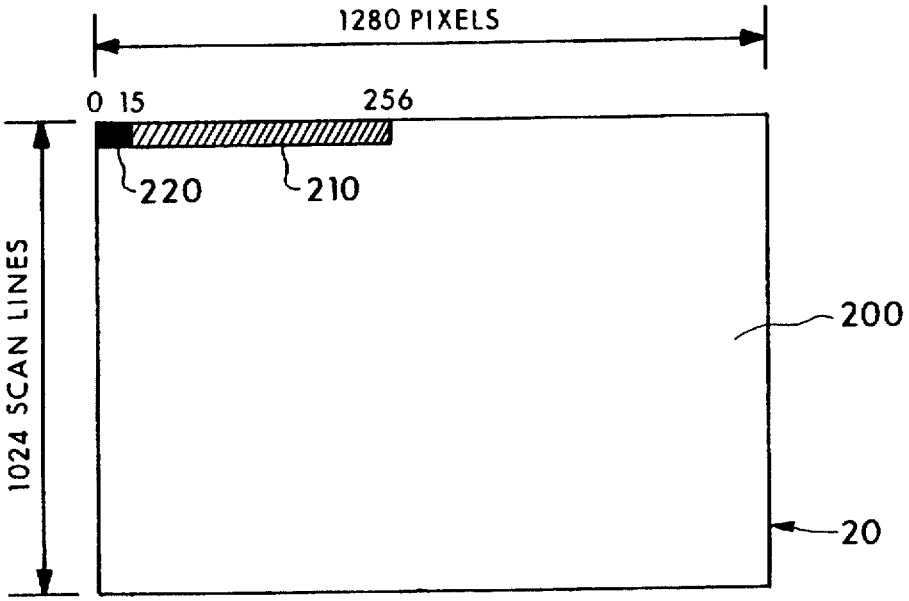
Fig. 2
Fig. 3
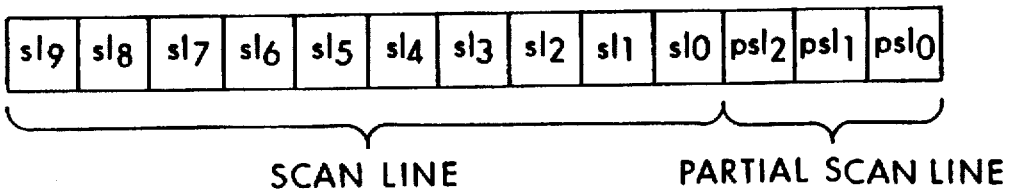
| | 10 | 09 | 08 | 07 | 06 | 05 | 04 | 03 | 02 | 01 | 00 |
|---|---|---|---|---|---|---|---|---|---|---|---|
| MSA | sl9 | sl8 | sl7 | sl6 | sl5 | psl2 | psl1 | psl0 | - | - | - |
| | 10 | 09 | 08 | 07 | 06 | 05 | 04 | 03 | 02 | 01 | 00 |
|---|---|---|---|---|---|---|---|---|---|---|---|
| LSA | - | - | - | - | - | sl4 | sl3 | sl2 | sl1 | sl0 | - |
Fig. 4

DYNAMIC VIDEO RAM
SERIAL PORT 1210
RANDOM PORT 1200
DYNAMIC LATCH
SERIAL DATA PORT
SERIAL STATE MACHINE
MEMORY BLOCK
BLOCK DECODE
WRITE MASK
DRAWING RULE
DEST LATCH
ADD REG
DATA REG
OUTPUT CONTROL
RANDOM STATE MACHINE
/SOE
SCLK
/LOAD
En_DL
MROW MCOL H/V
PRECH
WP
NEW
OLD
ALL
START
STOP
/WE
V/I
DR
SRC
DEST
En_MSA
CLK_LSA
/IRFRSH
CLK_Din1
En_Din2
R/W
/OE
RCLK
/CS
SL

Fig. 14

| | 15 | 11 | 06 | 01 00 |
|---|---|---|---|---|
| Din 1 | | DRAWING RULE | START | STOP | |

| | 15 | 00 |
|---|---|---|
| Din 2 | SOURCE DATA | |

Fig. 15

| | 15 | 11 | 06 | 01 00 |
|---|---|---|---|---|
| Din 1 | | DRAWING RULE | START | STOP | H/V |

| | 15 | 00 |
|---|---|---|
| Din 2 | | — | |

Fig. 16

| | 31 | 30 | 29 | 28 | 27 | . . . | | | | | | | | | | 16 | 15 | 14 | 13 . . . |
|---|---|---|---|---|---|---|---|---|---|---|---|---|---|---|---|---|---|---|---|
| DEST | 0 | 0 | 1 | 1 | 1 | 0 | 0 | 1 | 1 | 0 | 1 | 1 | 0 | 1 | 1 | 1 | 1 | 0 | 0 |
| SRC | 1 | 1 | 1 | 1 | 1 | 1 | 1 | 1 | 1 | 1 | 1 | 1 | 1 | 1 | 1 | 1 | 1 | 1 | 1 |
| NEW | 1 | 1 | 0 | 0 | 0 | 1 | 1 | 0 | 0 | 1 | 0 | 0 | 1 | 0 | 0 | 0 | 0 | 1 | 1 |
| MASK | WRITE PROTECT | | | | | | | WRITE | | | | | | | | | | WRITE PROTECT | |
| MEM | 0 | 0 | 1 | 1 | 1 | 0 | 0 | 0 | 0 | 1 | 0 | 0 | 1 | 0 | 0 | 0 | 1 | 0 | 0 |

Fig. 17

| | 15 | 14 | 13 | 12 | 11 | | | | . . . | | | | | | 1 | 0 . . . |
|---|---|---|---|---|---|---|---|---|---|---|---|---|---|---|---|---|
| DEST | 1 | 1 | 1 | 0 | 0 | 1 | 1 | 0 | 1 | 0 | 0 | 0 | 0 | 0 | 1 | 0 |
| SRC | 1 | 1 | 0 | 1 | 1 | 1 | 1 | 0 | 0 | 0 | 0 | 0 | 1 | 1 | 1 | 1 |
| NEW | 0 | 0 | 1 | 1 | 1 | 0 | 0 | 0 | 1 | 0 | 0 | 0 | 1 | 1 | 0 | 1 |
| MASK | WRITE PROTECT | | | | WRITE | | | | | WRITE PROTECT | | | | | | |
| MEM | 1 | 1 | 1 | 0 | 0 | 1 | 1 | 0 | 1 | 0 | 0 | 0 | 0 | 0 | 1 | 0 |

Image Read / Write page mode

DYNAMIC VIDEO RAM INCORPORATING SINGLE CLOCK RANDOM PORT CONTROL

Matter enclosed in heavy brackets [ ] appears in the original patent but forms no part of this reissue specification; matter printed in italics indicates the additions made by reissue.

BACKGROUND OF THE INVENTION

1. Related Applications

This Invention is related to Dynamic Video Ram Incorporating on Chip Vector/Image Mode Line Modification, Ser. No. 07/277,687, filed Nov. 29. 1988 and Dynamic Video Ram Incorporating on Chip Line Modification, Ser. No. 07/277,637, filed Nov. 29, 1988.

2. Field of the Invention

The invention relates to a dual ported, dynamic memory designed for use in raster scan graphic applications and, more particularly, to a high density dynamic video RAM incorporating on a single integrated circuit chip a single random port clock for operation of the random port side of the RAM.

3. Statement of the Problem

With the cost per bit of semiconductor memory and the price of computer systems dropping, personal work stations and other computer systems using graphics such as CAD/CAM systems are becoming more readily available. A crucial component in such systems is the dynamic video RAM which supports the graphics applications.

Conventional dynamic video RAMS, available on multi-chips have a random port and a serial port enabling a computer to access the dynamic video RAM through the random port and enabling the serial port to deliver the necessary graphics information to drive, for example, a color monitor.

In designing dynamic video RAMS, several features are of critical importance.

First, it is important to package the video RAM on a single integrated circuit chip while minimizing the number of external pins from the chip. Secondly, it is important to maximize the memory contained on the chip. Third, it is important to perform as many or the modification operations on chip, rather than having off chip hardware perform these operations at a slow rate off the chip. Fourth, it is important to maximize the addressing capabilities of the data stored within the chip. The number of clock inputs controlling the random port of the video RAM leads to complexity and slower speed.

The following patents are representative of issued patents involving the use of clocks in dynamic RAMs commercially available.

The 1987 patent issued to Novak, et al. (U.S. Pat. No. 4,688,197) sets forth a video computer system having a RAM chip with a shift register connected to its serial output terminal which is actuated by a first clock and a second clock is utilized to load the serial chip register.

The 1987 patent issued to Redwine et al. (U.S. Pat. No. 4,689,741) pertain, to the same invention as the '197 patent but provides for coupling of data between column lines and the chip register.

The 1985 patent to Bruce (U.S. Pat. No. 4,546,451) sets forth a dynamic RAM which permits "page mode" addressing. While Bruce shows a graphics controller device (GDC) clock, this clock is delivered from the RAM chip to the separate GDC. More importantly, the separate GDC must provide the load, count enable and other control signals directly to the RAM chip.

The 1987 patent to Thaden (U.S. Pat. No. 4,665,495) sets forth a single chip dynamic RAM controller and CRT controller system arrangement. This invention minimizes the control circuit of prior systems thus eliminating potential bottle necks at the RAM by utilizing a single controller. A related patent also issued to Thaden et al. is U.S. Pat. No 4,656,596. The RAM of Thaden resides on a chip separated from the controller chip and the control signals are sent to the RAM.

The 1987 patent to Voss (U.S Pat. No. 4,646,270) sets forth a video graphic dynamic RAM having the capability of serially reading out data at a high rate of speed while performing standard RAM operations.

In the above patents, no provision is made for utilizing a single clock on the random port side of the RAM to control the operation of the RAM including the loading of information into the address and data registers, the operation of the RAM and the modification of the information in the RAM.

4. Solution to the Problem

The present invention provides a solution to the above problem. Under the teachings of the present invention, a single clock pulse drives an internal state machine to provide the control pulses thereby minimizing the number of signal paths to and from the chip while providing for a faster operation.

SUMMARY OF THE INVENTION

The present invention, in a preferred embodiment, uses a 1,310,720 bit dual ported, dynamic memory having random and serial ports. This is well over one million bits of stored information. The random port supports the two modes of access: a vector access to a 32 by 32 bit page and an image access to a 16 by 1 word. The serial port consists of eight, thirty-two bit dynamic latches providing 256 consecutive bits for a screen refresh. The dynamic video RAM of the present invention incorporates built-in drawing rule cycles, a clocked random port for synchronous operation, optimised vector operation and sixteen bit read and write access.

In the preferred embodiment, the video RAM is packaged on a chip where the random port is accessed by an eleven pin address, a sixteen pin data path, chip select, vector/image select, read/write signal and random port clock. The serial port is supported by the serial clock, serial output enable, load signal and four serial output data line. The chip is powered by at least two Vcc and two Vss line. While the preferred invention has at least forty-four pins on this chip, more pins could be added.

In the vector mode of operation, the dynamic video RAM of the present invention writes both horizontal and vertical vectors to a thirty-two by thirty-two bit page. The cells within a page in the preferred embodiment are addressed as a thirty-two bit vertical or horizontal vector column or row. However, the calls could be any desired selection such as "n"×"m." The address selects the page location of the vector and the row-column of the vector within the page. The data lines carry START and STOP locations within the page and the horizontal/vertical orientation of the vector within the cell. The drawing rule of the vector is also carried on the data lines with a source of the vector always defaulting to one. Once selected, a vector page can be accessed as a series of page mode cycles specifying column or row and START and STOP locations. In the preferred embodiment, vectors are a write only.

Under the image mode of operation, the dynamic video RAM of the present invention allows the random access memory port array to be written and read directly. On writes, the address input of the address lines selects a thirty-two by thirty-two bit page, the page identical to that selected in vector mode. The row within the page is identical to the vector row selected while in the vector mode. The word is masked according to the START and STOP locations specified in the first data mode of the cycle. This first data word also carries the drawing rule specification. The second data word of the cycle carries the sixteen bit word image word. Reads are also sixteen bits wide and the address is specified in the write cycle with the addition of the to least significant address to control whether the least or the most significant word in the row is placed on the sixteen bit data bus. The START, STOP, and drawing rule have no effect on read cycles. Page node works for both reads and writes, allowing the full thirty-two by thirty-two page to be accessed in one page cycle. The present invention provides a conventional internal refresh to the memory.

Finally, transferring data to the shift register is accomplished by executing a cycle with the vector/image line asserted to vector and the read/write line asserted to read. This places the contents of 256 cells in a dynamic latch ready to be loaded into the serial port register. While only 256 cells are written to an internal latch, the full 8,192 cells are accessed and refreshed during the serial data transfer. The 256 bits transferred during the transfer are referred to as a partial scan line and replacement rules have no effect on serial data transfer.

All of the above random port operations (i.e., not the transfer through the serial port) are accomplished through the use of a single clock pulse delivered to a random state machine and in conjunction with the enable levels of the V/I (vector-Image), R/W (read-write), refresh and the CS (chip-select) control lines.

DESCRIPTION OF THE DRAWING

FIG. 2 illustrates the screen of the color monitor of the system of FIG. 1 and a partial scan line;

FIG. 3 illustrates the serial data transfer address or the present invention;

FIG. 4 illustrates the most significant address and least significant address of the serial data transfer address of FIG. 3;

FIG. 14 sets forth the format of the data inputs for the image mode of operation;

FIG. 15 sets forth the format for the data inputs for the vector mode of operation;

FIG. 16 is an illustration of a vector mode operation;

FIG. 17 is an illustration of an image mode operation;

DETAILED SPECIFICATION

1. General Description

Figure 1:
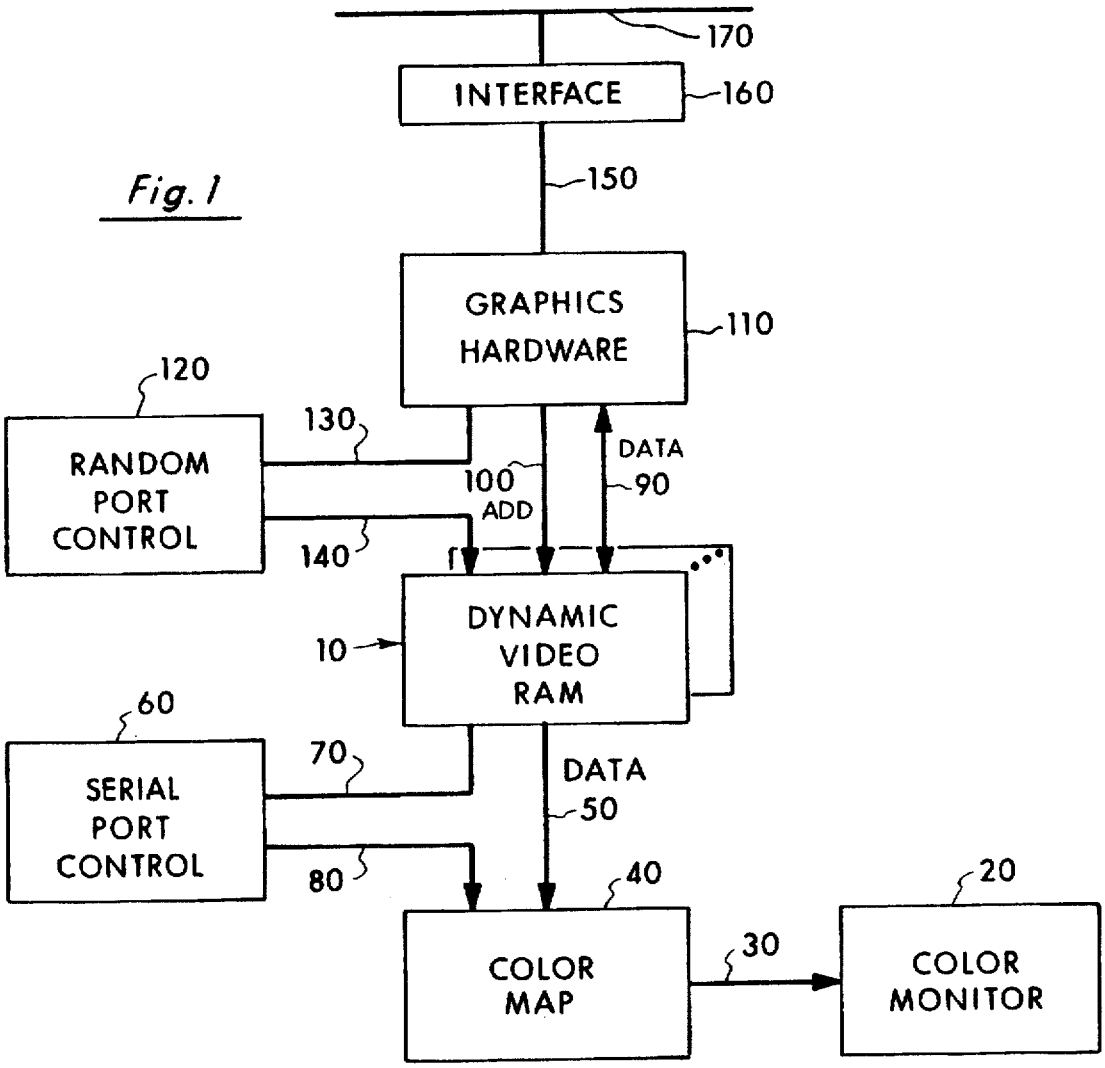
FIG. 1 is a block diagram of a system incorporating the dynamic video RAM of the present invention.

FIG. 1 sets forth the dynamic video RAM 10 of the present invention in a system environment having a color monitor 20 interconnected over lines 30 with a color map circuit 40. The color map circuit 40 is in turn connected over video data bus 50 to the dynamic video RAM 10 of the present invention. Both the dynamic video RAM 10 and the color map 40 are under control of a serial port control 60 over lines 70 and 80. The dynamic video RAM 10 is also interconnected over a data bus 90 and an address bus 100 to a graphics hardware circuit 110. A random port controller 120 controls the graphic hardware circuit 110 over lines 130 and the dynamic video RAM 10 over lines 140. The graphics hardware circuit 110 is interconnected over lines 150 to an interface circuit 160 which communicates with a standard bus 170.

The dynamic video RAM 10 of the present invention stores the image which is actually being displayed on the color monitor 20. The stored information in the video RAM 10 is delivered over the data bus 50, sequentially, to the color map circuit 40 for display on the monitor 20. The serial port control 60 controls the transfer or the stored information in the dynamic video RAM 10 to the color map 40.

When it is desired to change the stored information in the dynamic video RAM 10 in order to change the displayed image on the color monitor 20, appropriate commands come over bus 170 such as from a CPU or the like, not shown, and is received by the interface circuit 160 for delivery into the graphics hardware circuit 110. The random port control 120 controls the changing of the information stored in the dynamic video RAM based upon the information received by the graphics hardware from bus 150. The address for the information to be changed is delivered over address bus 100 and the data for the change is delivered over data bus 90. In this fashion, the dynamic video RAM information can be modified to change the image on the color monitor 20.

It is to be expressly understood that the system environment shown in FIG. 1 is for purposes of illustration only and that the dynamic video RAM of the present invention could be utilized in other environmental. For example, a color map and color monitor may not be present.

Figure 12:
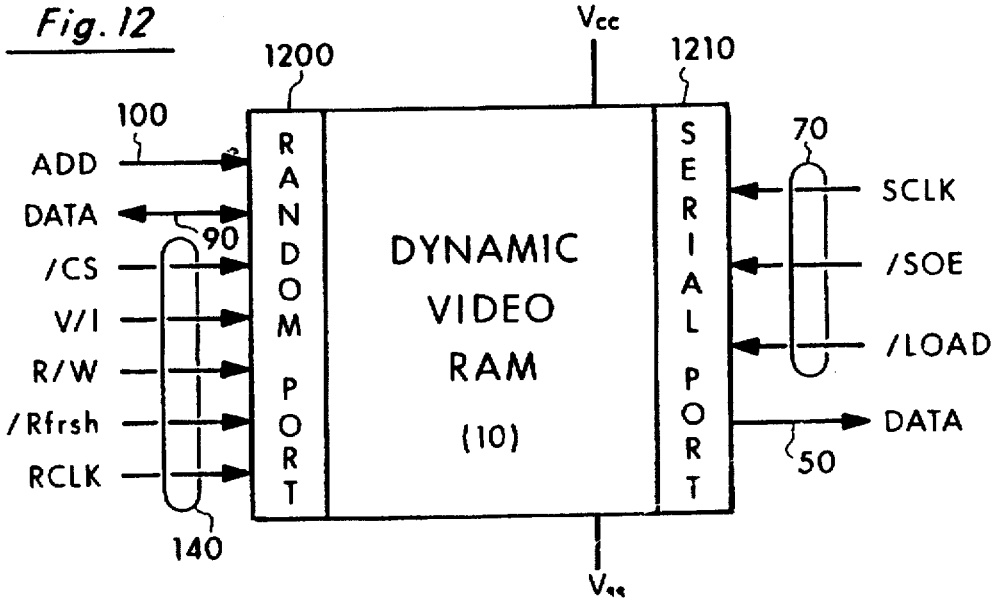
FIG. 12 illustrates the structure of a single chip of the dynamic video RAM of the present invention.

In the preferred embodiment of a single chip as shown in FIG. 12, the random port bus comprises an address bus 100 which is eleven bits wide, a data bus 90 which is sixteen bits wide and a control bus 140 which is five bits wide. The serial port bus comprises a data bus 50 which is four bits wide and a control bus 70 which is three bits wide. Hence, the dynamic video RAM 10 has thirty-nine pins plus four pins for power and ground for a total of forty-four. The present invention as set forth next, however, is not limited to a configuration having this number or pins. As shown in FIG. 1, a number of these single chips can be utilized in a system environment. The /CS control enable carried by control bus 140 selects which chip is accessed.

Three modes of addressing and operating the dynamic video RAM 10 over address bus 100 are present. They are (a) the serial data transfer mode, (b) the vector address mode, and (c) the Image address mode. Each mode will be discussed in the following.

a. Serial Data Transfer Mode

In FIG. 2, the screen 200 of monitor 20 is shown. Screen 200 is conventional and may have, for example, 1280 pixels across the screen in a horizontal line with 1024 scan or raster lines in the vertical direction. It is to be expressly understood that any configuration of pixels and scan lines could be used under the teachings of the present invention. In FIG. 2, a partial scan line 210 is also shown. A "partial scan line" is defined herein to be 256 contiguous pixels in a scan line. A "word" is defined to be 16 pixels. Hence, a partial scan line contains 16 words. This corresponds to conventional image mode addressing found in other video RAM devices.

The dynamic video RAM 10 of the present invention is capable of being addressed over random port address bus 100 to perform serial port data transfers over data bus 50. In FIG. 3, the serial data transfer address is shown. The 1024 scan lines are selected by the ten bit scan line field and the partial scan lines 210 are selected by the three bit partial scan line field. A total of thirteen bits are required to perform serial data transfer addressing. Since address bus 100 is only eleven bits wide, two addresses are delivered as shown in FIG. 4. The first transfer being the most significant address (MSA) and the second transfer being the least significant address (LSA). Again, it is to be expressly understood that the present invention is not limited to this number of bits or to this configuration of addressing.

FIGS. 2–4, therefore, show the serial data transfer mode of addressing the dynamic video RAM 10 of the present invention.

b. Vector Addressing Mode

The present invention provides a mode of vector addressing wherein a page can be accessed either horizontally or vertically on the screen. This is shown in FIGS. 5–8.

Figure 5:
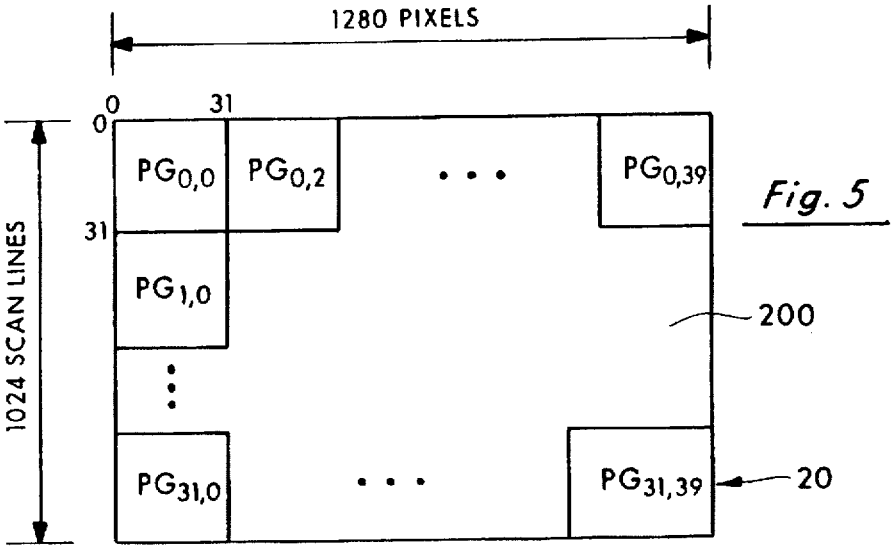
FIG. 5 sets forth the page layout of the screen of the color monitor 20 of the present invention.

A page is defined to be a 32 by 32 array of pixels. In FIG. 5, the page PG (0,0) has 32 horizontal scan lines by 32 vertical pixels. It is to be expressly understood that a page could be of any similar "m"×"n" configuration. The screen monitor of FIG. 5 has 32 times 40 or 1280 pages. The term "page column" is defined to be the horizontal location of a page and the term "page row" is the vertical location of a page. For example, for page PG (31,39), the page column is 39 and the page row is 31. The page row in the preferred embodiment of 32 rows can be addressed by a 5 bit word. For example, the page row value for page PG (31,0) is 11111. Likewise, the 40 page columns, in the preferred invention of 1280 pixels can be addressed by a six bit word.

Figure 6:
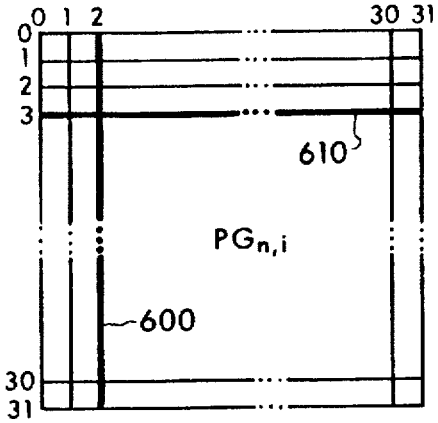
FIG. 6 shows vectors within an individual page.

FIG. 6, shows an individual page PG (n,i). The term "vector column" identifies the vertical location of a vector within a page. For example, vector 600 is located in vertical row 2. The term "vector row" is defined to mean the horizontal location at a vector within a page. For example, vector 610 is located in column 3. In the vector mode addressing scheme of the present invention, one bit, the H/V bit is used to define whether the vector is horizontal 610 or vertical 600. Five bits are then utilized to locate the vector within the page. For example, for the vector 610, the H/V bit equals 1 to designate a horizontal vector and the remaining 5 bits are 00011. The vertical vector 600 has the H/V bit set to 0 and the remaining 5 bits are 00010.

The vector addressing scheme shown in FIGS. 5 and 6 is unique to the present invention and permits not only a select page PG to be addressed but also to address a vertical or horizontal vector within the page.

Figure 7:
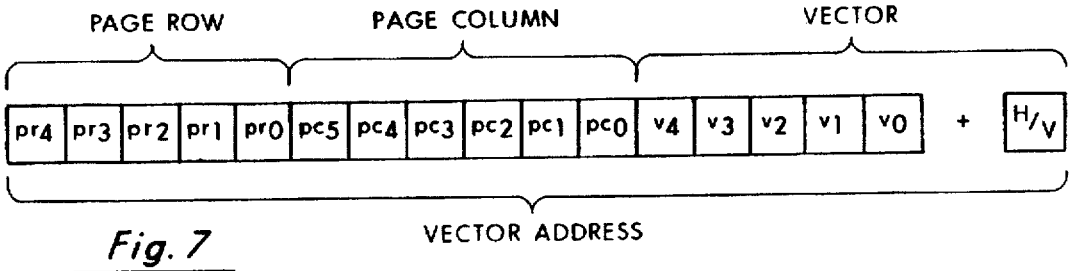
FIG. 7 is the format for a page address.

Therefore, the necessary page address as shown in FIG. 7 and in the preferred embodiment, is a 16 bit word having 5 bits to identify the page row, 6 bits to identify the page column, and 5 bits to identify the vector. The additional horizontal/vertical (H/V) bit identifies whether the vector is horizontal or vertical within the page. In this fashion, a specific vector such as either vector 600 or 610 in FIG. 6 in a selected page on the screen 200 can be addressed.

Since, the address bus 100 in FIG. 1 is 11 bits wide, the graphics hardware 100 outputs the vector address of FIG. 7 as two separate transfers. The first transfer being the most significant address (MSA) and the second address being the least significant address (LSA) both shown in FIG. 8.

It is to be expressly understood that FIGS. 5 through 8 set forth one approach under the teachings of the present invention and that other bit layouts and address configurations could be used to accomplish the vector mode of addressing.

c. Image Address Mode

Figure 9:
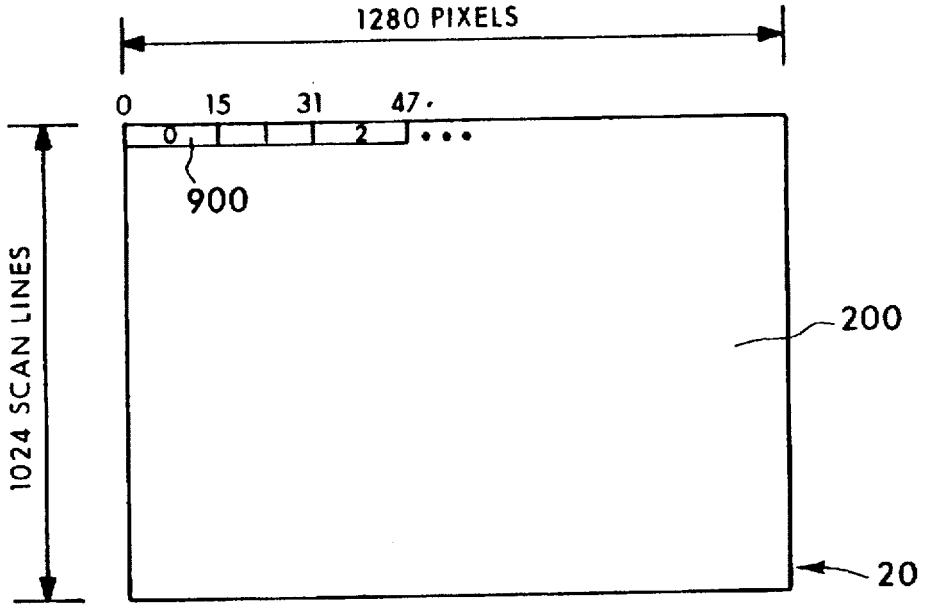
FIG. 9 shows the Image mode addressing scheme of the color monitor of the present invention.
Figure 10:
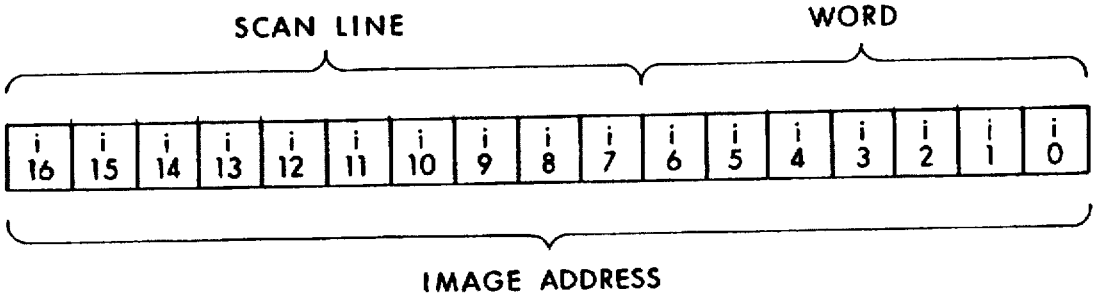
FIG. 10 shows the format of the image address.
Figure 11:
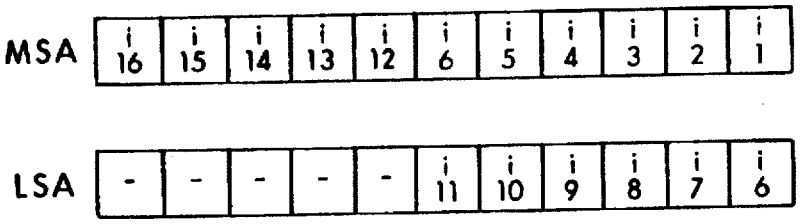
FIG. 11 shows the most significant and least significant address portions of the Image address of FIG. 10.

The present invention is also capable of conventional image mode addressing as shown in FIGS. 9–11. To locate a scan line on screen 200, would require 10 bits in the example shown of 1024 scan lines. A scan line is defined as the set of contiguous pixels making up a complete scan line on a raster scan display. There are eighty 16 bit words in a scan line. Therefore, seven bits are required to locate a word in a given scan line. Hence, the image address as shown in FIG. 10 has 10 bits to identify the scan line and 7 bits to identify a word within the scan line. Because of the structure of the video RAM of the present invention, the address bus 100 as shown in FIG. 1 is limited to 11 bits and, therefore, as shown in FIG. 11, the image address is transferred in an MSA cycle and an LSA cycle.

As discussed above, three modes of addressing occur on address bus 100. These three modes are serial data transfer (FIGS. 2–4), vector mode addressing (FIGS. 5–8) and image mode addressing (FIGS. 9–11) cause the video RAM of the present invention to operate in these different modes. The serial data transfer mode effectuates transfer of information from the RAM 10 over data bus 50. The vector and image modes permit changes to be made to the information stored within the RAM 10.

d. Chip Configuration

In FIG. 12, the dynamic Video RAM 10 of the present invention is shown as a discrete single integrated circuit chip. With reference back to FIG. 1, the random port side 1200 of the RAM 10 has the following pin designations:

1. Address Bus 100 (11 pins)
2. Data Bus 90 (16 pins)
3. /CS-chip select
4. V/I—Vector/Image Select
5. R/W - Read/Write Select 6. XRfrsh - Refresh
7. Rclk - Random Port Clock On the serial port side 1210 of the dynamic video RAM 10 the following pins are designated:

1. Sclk - Serial Clock
2. /SOE - Serial Output Enable
3. /LOAD - Load Signal
4. Data Bus (4 pins)

In addition, two voltage, Vcc, pins and two ground pins, Vss, are required.

The chip select signal (/CS) selects which chip is being selected. For example, in FIG. 1, any number of chips 10 can be positioned within the system environment. If, for example, sixteen chips are required, then the appropriate /CS pin would be activated by the random port control 120.

A previously discussed, the vector-image signal (V/I) determines whether the chip is being addressed in the vector or image modes. In the preferred embodiment, when V/I is high, the chip is In the vector mode and when the V/I signal is low, the chip executes in the image mode.

The read/write signal (R/W) performs as follows. When R/W is high, the chip 10 is in the read mode and data appears on data bus 90. When R/W is low, the chip is in the write mode and the data is written into the memory found within chip 10. The following modes of operation occur within the chip 10:

TABLE I

| V/I | R/W | Cycle |
|---|---|---|
| 0 | 0 | Image write |
| 0 | 1 | Image read |
| 1 | 0 | vector write |
| 1 | 1 | serial data transfer |

The random port clock (Rclk) is a single clock signal delivered to the chip 10. All internal port operations of the chip 10 are synchronized with and derived from this clock signal. This is the only clock signal to the random port and is preferably one megahertz.

Figure 8:
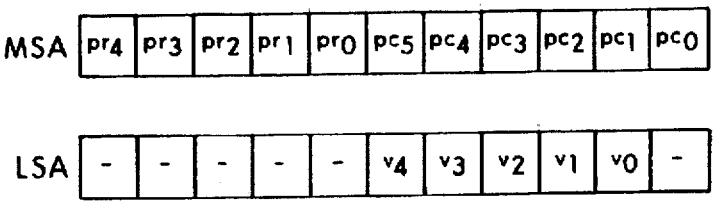
FIG. 8 shows the most significant address and least significant address bits of the page address of FIG. 7.

The address signals on random port bus 100 carries the bit addresses for the MSA and LSA addresses as shown in FIG. 4 for serial data transfer, in FIG. 8 for vector mode addressing, and in FIG. 11 for image mode addressing.

The data appearing on random port data bus 90 is sixteen parallel bits and is delivered into the chip 0 as two sets of data - Din1 and Din2. This is shown in the following table:

TABLE II

| Mode | Din1 | Din2 |
|---|---|---|
| Vector | DR, Start/Stop, H/V | — |
| Image | DR, Start/Stop | Read or Write |
| Data | — | — |

(Where DR = Drawing Rule, H/V = Horizontal/Vertical)

Also delivered to the RAM 10 of the present invention from the random port control 120 is a /Refresh which is used as an internal refresh signal.

The RAM 10 of the present invention also receives control signals from the serial port control 60 over serial port control bus 70. The Sclk signal is a single serial port clock, the /SOE is a serial output enable signal. When /SOE is low, serial read data appears on the data bus 50. The /LOAD is a data load signal. The present invention only uses a single clock on the serial port 1210 to transfer data over the serial port.

The two Vcc pins shown in FIG. 12 provide power which in the preferred embodiment is plus five volts and the Vss pins are the two ground pins. More or less than two pins for power and ground can be used under the teachings of the present invention.

The single integrated chip shown In FIG. 12 contains in the random port 1200 and in the serial port 1210 all of the necessary circuitry to operate the RAM in the three modes of operation (Serial data transfer, Vector addressing and Image Addressing). The random port is controlled through receipt of one of a plurality of sets of control enables over bus 140 which configure the RAM to operate in its various modes of operation. The delivery of the single clock Rclk then is used to produce the necessary internal control enables to execute the selected mode of operation.

The signals appearing on the pins shown in FIG. 12 will now be discussed in the following detailed description of the internal configuration and operation of the dynamic video RAM 10 of the present invention. It is to be expressly understood that the pin number and selection represents only a preferred embodiment and that other embodiments may be designed within the teachings of the present invention.

2. Detailed Description

This section discusses the detailed structural embodiment of the dynamic video RAM chip 10 of the present invention and the preferred operation. The individual register, latch, shift, and other disclosed circuits are individually conventional in operation and design. The combined circuit layout, however, is unique and while one preferred layout is shown, it is to be expressly understood that other layouts based upon the teachings of this invention could be used.

a. Serial Port Side 1210 Configuration

Figure 13:
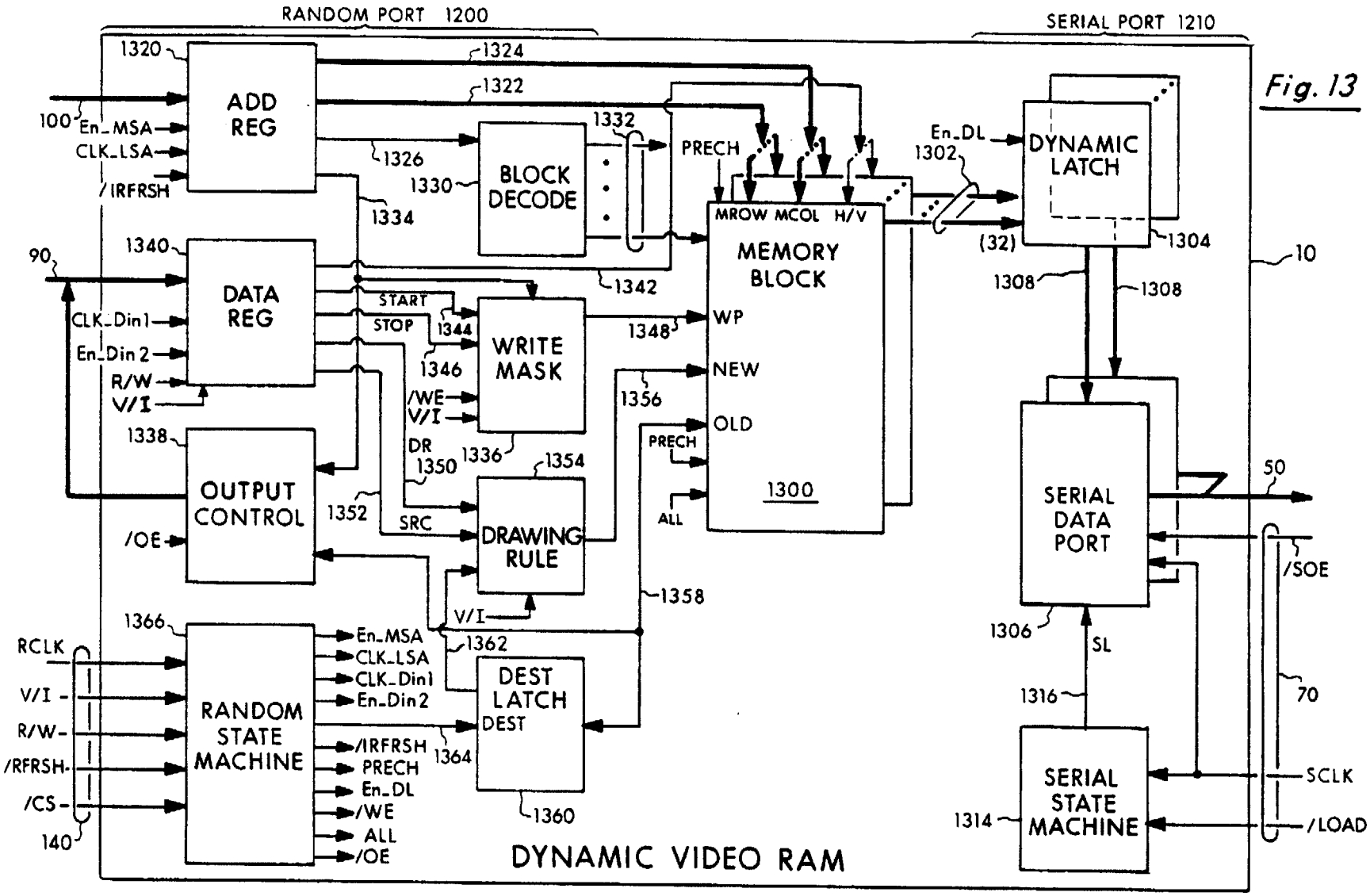
FIG. 13 sets forth the circuit block diagram of the dynamic video RAM chip of the present invention.

The components of the dynamic video RAM 10 of the present invention are set forth in FIG. 13 to include a plurality of memory blocks 1300. Each memory block 1300 is in the preferred embodiment, 160 memory cells by 1024 memory cells. There are 8 memory blocks for a total of 1,310,720 cells on a single chip although it is to be expressly understood that any number could be used.

The output from the memory block 1300 is delivered over lines 1302 into a plurality of dynamic latches 1304. Each dynamic latch stores 32 bits of information as read from its respective interconnected memory block 1300. The eight latches, therefore, hold 256 bits or a partial scan line. The output of each dynamic latch 1304 is delivered to a respective serial data port register 1306 over interconnecting lines 1308. Each serial data port 1306 contains a 32 bit register which is capable or delivering 4 bits, in a serial fashion, onto data bus 50 for delivery, for example, into the color map 10 as shown in FIG. 1. The control signals 70 from the serial port control 60 are delivered into the serial state machine 1314. Which is interconnected over lines 1316 to the serial data port in order to control the serial reading of information from the memory block 1300.

Hence, the dynamic latch 1304, the serial data port 1306, and the serial state machine 1314 constitute the serial port side 1210 of the dynamic video RAM 10 of the present invention.

b. Random Port Side 1200 Configuration

The random port side 1200 includes an address register 1320 which is interconnected to the random port address bus 100 and is further connected over lines 1322 (eight bits) and 1324 (five bits) to the memory block 1300. The address register 1320 is also interconnected over lines 1326 (three bits) to a block decode circuit 1330 which is interconnected over lines 1332 to the memory block 1300. The address register Is also interconnected over line 1334 to the write mask 1336 and to the output control 1338.

The data register 1340 is interconnected to the data bus 90 and is further interconnected over the 1342 (H/V bit) to the memory block 1300, over lines 1344 (START - five bits) and 1346 (STOP - five bits) to the write mask 1336. The write mask 1336 is further interconnected over lines 1348 (32 bits) to the memory block 1300. The data register 1340 is further interconnected over lines 1350 (four bits) and 1352 (sixteen bits) to the drawing rule circuit 14 which in turn is interconnected over lines 1356 (thirty-two bits to the memory block 1300.

The output control 1338 is also interconnected to the random port data bus 90 and is also interconnected over lines 1358 to the memory block 1300. Destination latch 1360 is also connected to lines 1358 and is further connected over lines 1362 (thirty-two bits) to the drawing rule circuit 1354 and over line 1364 to the random state machine 1366. The random state machine 1366 receives the random port control input signals over random port control bus 140.

Hence, the address register 1320, the block decode circuit 1330, the data register 1340, the write mask 1336, the output control 1338, the drawing rule circuit 1354, the destination latch 1360, and the random state machine 1366 Constitute the random port side 1200 of the dynamic video RAM 10 of the present invention. While a preferred embodiment of the present invention is shown, variations to the design could be made under the teachings of the claimed invention. For example, the latch 1360 could be designed using strobed combinational logic to deliver or hold the stored video information.

c. Serial Port Side 1210 Operation

The operation of the dynamic video RAM of the present invention will first be discussed with respect to the operation of the serial data transfer mode of operation wherein the information contained within the memory block 1300 is issued to generate the image, for example, on the color monitor 20 of FIG. 1. This scan line transfer mode of operation utilizes the addressing techniques shown in FIGS. 2–4.

Figure 18:
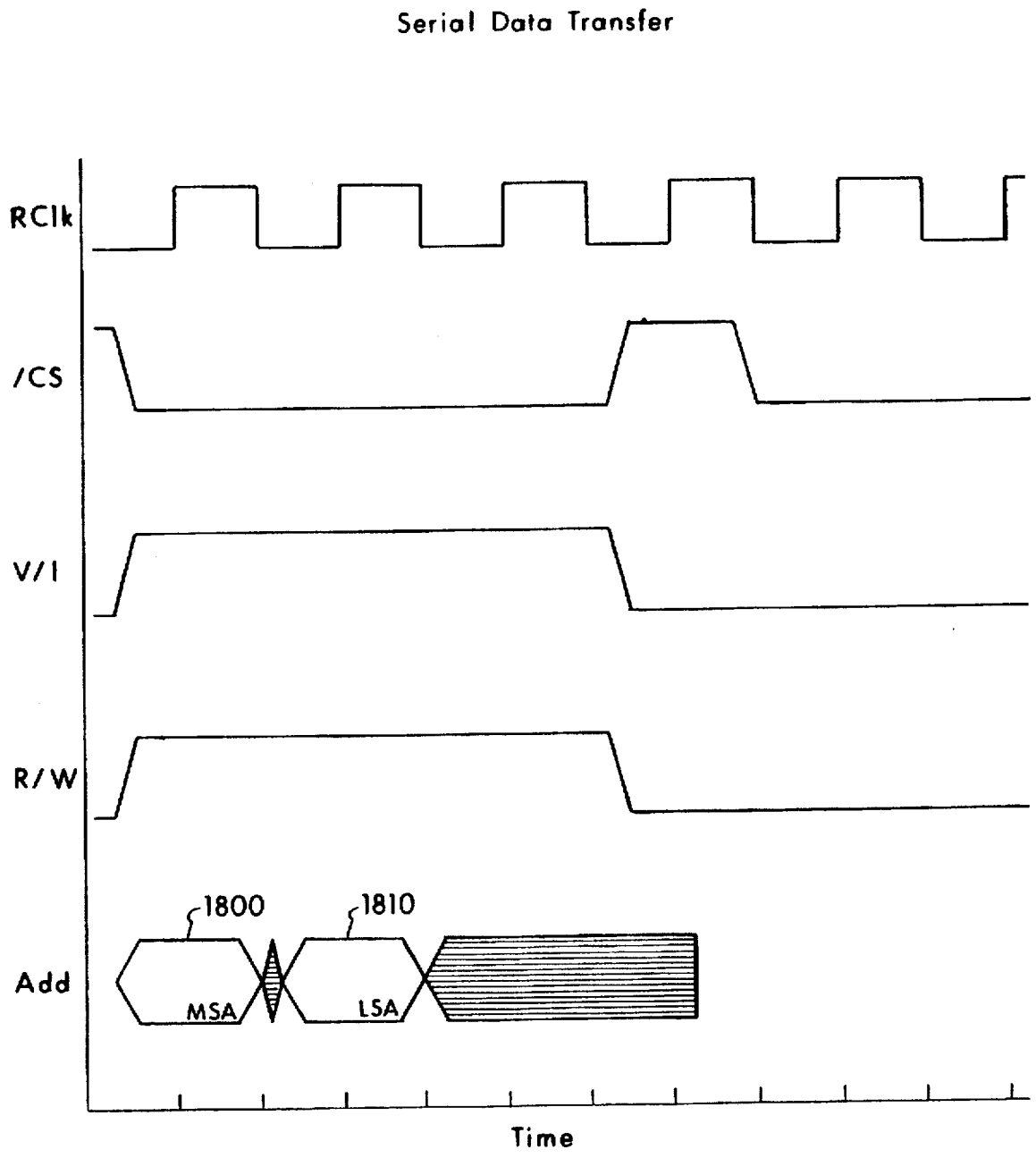
FIG. 18 shows the timing for serial data transfer.

In the timing and control diagram of FIG. 18, the Rclk /CS, V/I and R/W enables are delivered over random port control bus 140 from the random port control 120. The address ADD, is delivered over bus 100 from the graphics hardware 110. The /CS signal selects which dynamic video RAM chip 10 is being activated. In this mode of operation, i.e., serial data transfer the R/W bit is high to read the memory 1300. When a serial data transfer occurs the V/I bit, set high (sec Table I) (i.e., vector or image) is also selected and as shown in FIG. 18, the vector mode is selected. Hence, the address (MSA and LSA) of the data to be transferred from the memory 1300 to the dynamic latch 1304 is contained on bus 100 - see FIG. 4. The single clock signal Rclk causes the random stale machine 1366 to input the address (MSA and LSA) into the address register 1320 during a first time interval (i.e., at times 1800 and 1810) as shown in FIG. 8. When it is desired to read the memory block 1300 so that the contents can be serially delivered to the color map 40, the transfer of the addressed partial scan line for a screen refresh occurs in the following manner. Thirty two bits of information from each of the eight memory blocks 1300 are read over lines 1302 into the dynamic latches 1304. The dynamic latch 1304 receives a signal over line. En-DL from the random state machine 1366 indicating that it is to read the data from the memory block. All eight dynamic latches are so enabled and each will read in 32 bits for a 256 bit partial scan line. After reading EN-DL is appropriately activated to deliver the read information over lines 1308 into the serial data port 1306. Again this is a parallel transfer of 32 bits of information for each of the eight serial shift registers. Each of the eight serial data ports 1306 is under control of the serial state machine 1314 and the serial clock Sclk. When the serial data port 1306 is enabled over line SL, each clock signal transfers but four bits from a given serial data port 1306 to data bus 50.

The transfer of the data occurs in the following fashion. Serial state machine 1314 has a counter contained therein which counts the serial cock pulses Sclk. Hence, as the Sclk pulses come in, they are delivered to the serial data port 1306 which after eight such pulses sequentially gates out the 32 bits stored therein, four bits at a time. Then, the next eight Sclk pulses transfer the 32 bits out from that next memory block portion. In this fashion, the serial state machine 1314 is capable or causing the serial data port to transmit the stored data from each of the memory blocks until a partial scan line is transmitted. After a partial scan line is delivered, a /LOAD signal is received over serial port control bus 70 to the serial state machine 1314 and over line 1316 to load all of the serial data port with the data for the next partial scan line. The /SOE input to serial data port 1306 enables the multiplexer to deliver the information four bits at a time to the color map 40.

It is to be expressly understood that other conventional configurations for the serial port could be utilized under the teachings of the present invention. The serial port is asynchronous from the random port and can transfer data over bus 50 while the chip 10 is performing other operations.

d. Random Port Side 1200 Operation

The operation of the random port 1200 of the dynamic video RAM 10 will now be explained.

The term "drawing rule" is defined to be a logical operator combining a "source" and a "destination" upon write to the memory block 1300. Drawing rules, in the preferred embodiment, are specified by the following table.

TABLE III

| Drawing Rule | Product |
|---|---|
| 0000 | clear (all zeroes) |
| 0001 | source and destination |
| 0010 | source and (not destination) |
| 0011 | source |
| 0100 | (not source) and destination |
| 0101 | destination |
| 0110 | source xor destination |
| 0111 | source or destination |
| 1000 | source nor destination |
| 1001 | source R1or destination |
| 1010 | not destination |
| 1011 | source or (not destination) |
| 1100 | not source |
| 1101 | (not source) or destination |
| 1110 | source mind destination |
| 1111 | sci (all ones) |

The operation of this table will be discussed the following In addition, the present invention incorporates two data cycles termed Din1 and Din2. In FIG. 14, Din1 and Din2 are shown for the image mode of operation. FIG. 15 shows Din1 and Din2 for the vector mode of operation.

Under the teachings of the present invention the drawing rule function is incorporated directly in the dynamic video RAM chip 10. This permits faster modification of data within the memory block 1300. Conventional video RAM designs require that the information in the memory block be read out of the video RAM chip and be modified in another chip or circuit. After modification off the chip, it is rewritten back into the memory block. This is a slow process.

Under the teachings of the present invention up to 32 pixel elements can be changed in one operation. Conventional approaches use the image mode or operation whereas the present invention also incorporates the vector mode operation wherein a horizontal or vertical vector in a defined page can be modified and changed according to the selected design rule. This feature significantly speeds up the time for modification of the information contained in the memory block. For example, if under a conventional approach, a vertical line from screen 200 is to be modified, a number of horizontal scan lines would have to be read out of the memory in order to modify the one bit corresponding to the vertical line. Under the teachings of the present invention, only one vertical vector would have to be accessed and modified significantly increasing the performance of the system over conventional approaches. It is estimated that current video RAM systems can process these vectors at the rate or 300,000 to 700,000 vectors per second. Under the teachings of the present invention, three to four million horizontal and vertical vectors per second can be processed.

Figure 19:
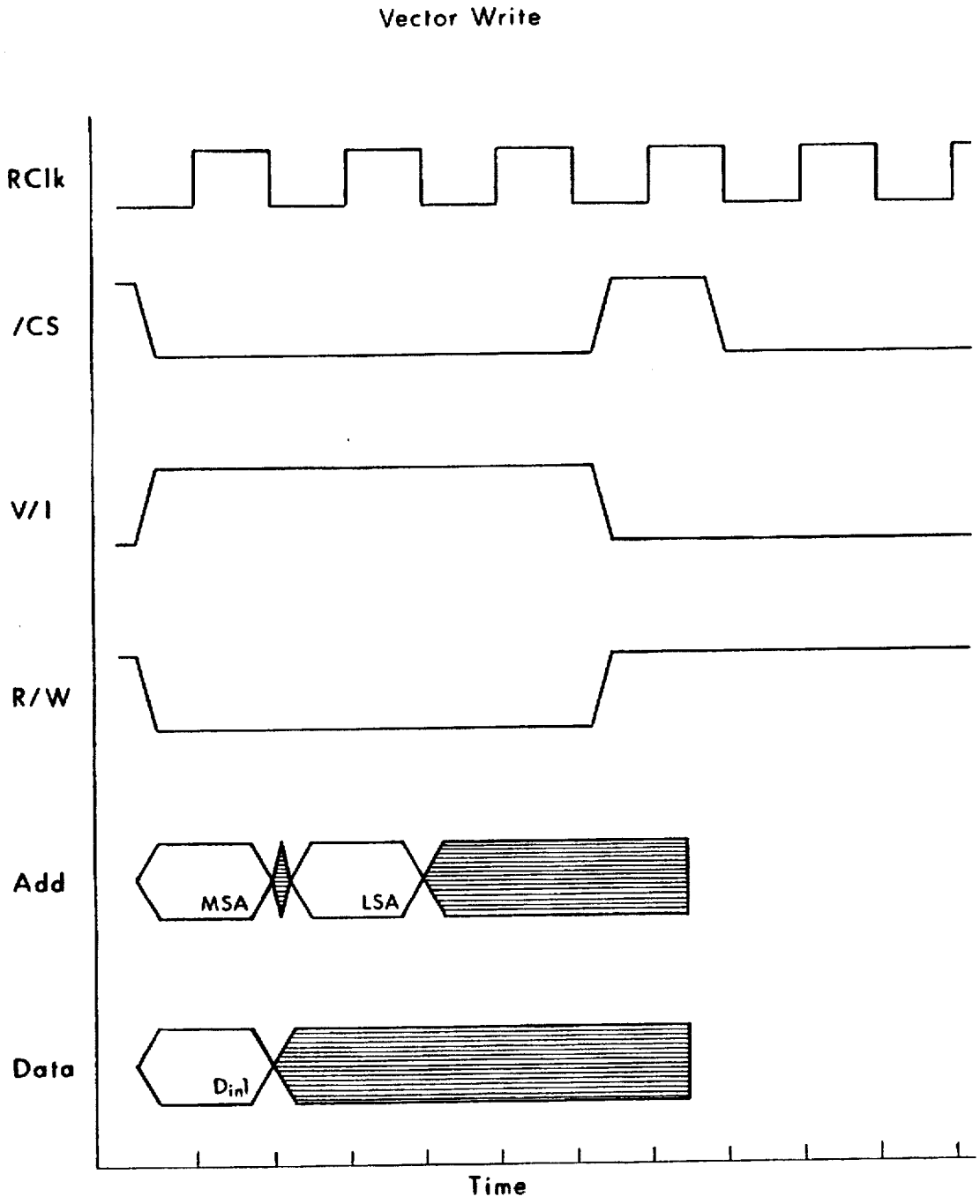
FIG. 19 shows the timing for vector write.

The speed up is due to the provision of the vector write mode of operation as will be discussed in the following. In the vector write mode of operation, the MSA and LSA addresses of FIG. 1 are sequentially loaded into the address register 1320. This is shown in the timing diagram of FIG. 19 where the /CS selects the proper chip, the V/I lead is high to select the vector mode, and R/W is low for write. Hence, the MSA and LSA of the address (FIG. 8) are loaded into the address register 1320 as well as the drawing rule, stat and stop (FIG. 15) over the random port data bus 90 into the data register 1340. The vector address (MSA and LSA) and the data (Din1) is delivered during a first time interval.

Figure 20:
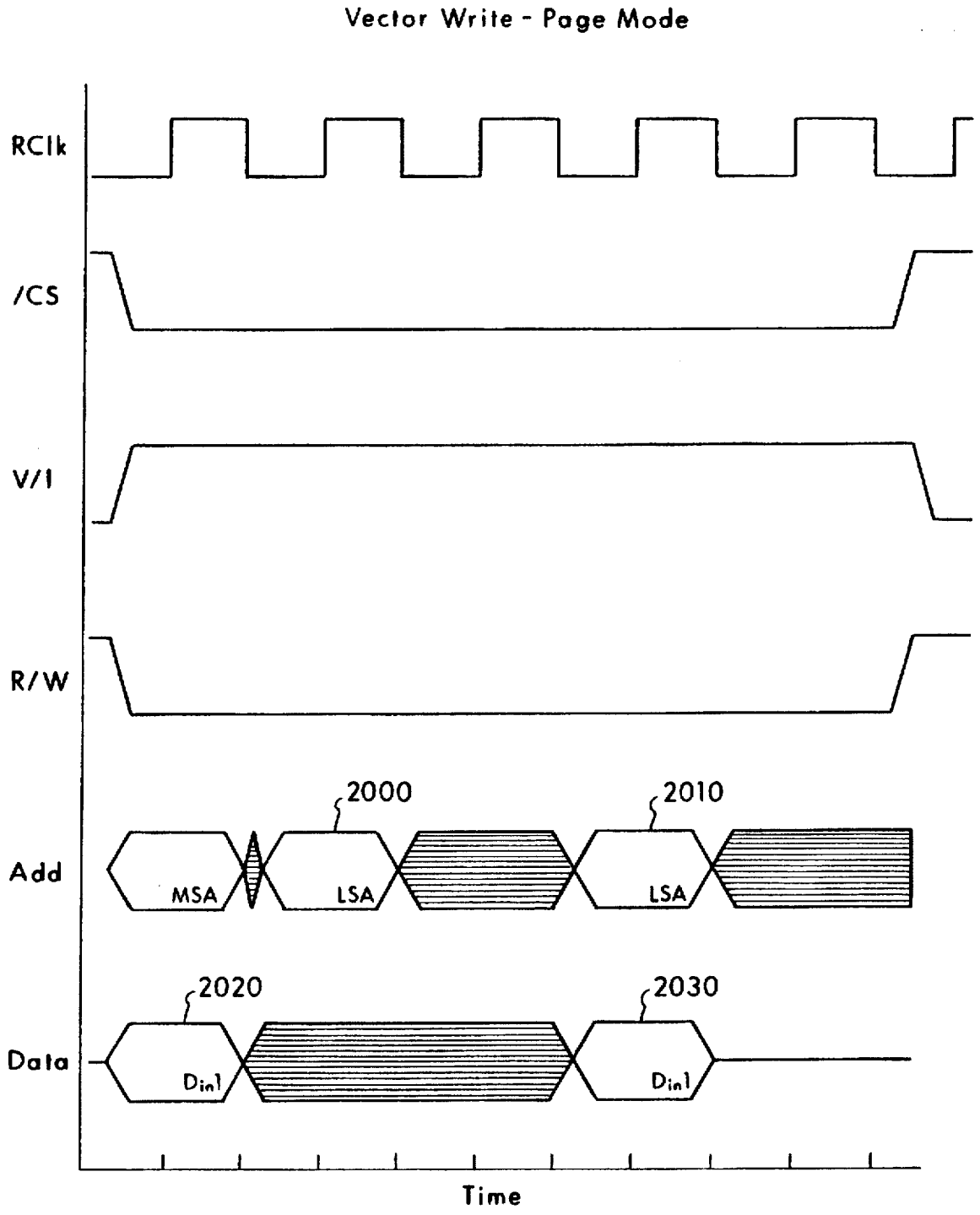
FIG. 20 shows the timing for vector write, page mode.

In FIG. 20, the timing for vector write, page mode is shown. Here, the MSA remains the same whereas the LSA and the Din are changed at times 2000 and 2010 for the LSA and times 2020 and 2030 for the Din1. The MSA and LSA addresses containing the page row, page column and vector identification of FIG. 8 and are stored into the address register 1320. Eight outputs are delivered over lines 1322 to address the memory row of memory block 1300, five of the bits are delivered over lines 1324 to address the memory column of memory block 1300, and the three remaining bits are delivered over lines 1326 to the block decode circuitry 1330. The block decode circuitry 1330 is simply a one out of eight decode to selectively activate one of the eight memory blocks 1300.

In the vector mode of operation, Din1 as shown in FIG. 15 is read into the data register 1340 over data bus 90. Din2 is not used in this mode. The five START bits are delivered over lines 1344 to the write mask 1336 and the five STOP bits are delivered over line 1346 to the write mask 1336. The four drawing rule bits are delivered over lines 1330 to the drawing rule circuit 1354. The H/V bit is delivered from the data register 1340 over line 1342 to the memory block 1300.

The address register is of conventional register design that enables data to be read from a bus and to store the information in the register. The address register is enabled to read the most significant address by the MSA enable and the least significant address by the LSA enable. Likewise, the data register 1340 is of conventional design and reads in data from the data bus 90 and stores it internally upon being selectively enabled by the Din1 and Din2 enable lines. At this point and time, the address register 1320 and the data register 1340 have the necessary vector information to identify either a horizontal or vertical vector to perform a drawing rule operation on it. Other circuits could be designed to perform the above described address and data functions.

In reference back to FIGS. 5–8, it is seen that a selected vertical 600 or horizontal 610 vector is composed of 32 pixel elements or when resident in the memory block 1300, 32 memory cells. The START and STOP information conveys the precise portion of the vector to be modified according to the drawing rule. For example, if the desired place to start the modification within a vector is seven bits from the start of the vector, the START command would be 00111 and if the STOP location is the fifteenth bit, the STOP command would be 01111. The START and STOP information is delivered to the write mask which provides 32 possible write protect WP signals over lines 1348. Hence in our example of starting at location 7 and stopping at location 15 in a 32 bit vector, the first seven bits would be activated in the write protect mode and the last sixteen bits would be activated in the write protect mode so that when NEW data is read back into memory over lines 1356 only the desired portion of memory cells between the START and STOP locations are written into the memory.

In FIG. 16 is shown an example of performing a drawing rule operation in the vector write page mode. The address register 1320 addresses a specific horizontal or vertical vector in the memory block 1300. Whether or not the vector is horizontal or vertical is determined by the H/V signal on lead 1342 which is the first bit in Din1 of FIG. 15. The OLD information is read out of the memory block on line 1358 and in FIG. 16 is designated DEST for "destination." It is to be noted that information could be delivered through the output control 1338 to data bus 90 for delivery back into the system if desired or into the destination latch 1360. The appropriate enable signal DEST on lead 1364 enables the destination latch 1360 to read in the OLD information. All 32 bits of the destination information of FIG. 16 are read into the latch 1360. The output 1362 of the destination latch 1360 is delivered as the destination input to the drawing rule circuit 1354. For vector mode operation, the SOURCE (SRC) signals on leads 1352 from the data register 1340 are set to all ones and are shown in FIG. 16. The drawing rules are set forth in TABLE III.

In the example of FIG. 16 the "not destination" drawing rule 1010 appears in the data register 1340. Hence, the OLD information or destination data DEST is inverted to result in a new modified vector which is termed NEW as shown in FIG. 16. However, the writing of this information into the memory block occurs under control of the write mask 36 and as previously explained, for our example, bits 31–26 and 15-0 are write protected. Only bits 25–16 of the NEW data can be written into memory. In a similar fashion, all of the logical functions of the drawings rules can be implemented for the entire vector or a portion thereof based upon the START and STOP information.

In the vector mode of operation, up to 32 pixel elements stored in memory block 1300 can be changed in one operation on chip. The present invention is capable of changing a vector located either horizontally or vertically as shown in FIG. 6 through use of the H/V bit.

Figure 21:
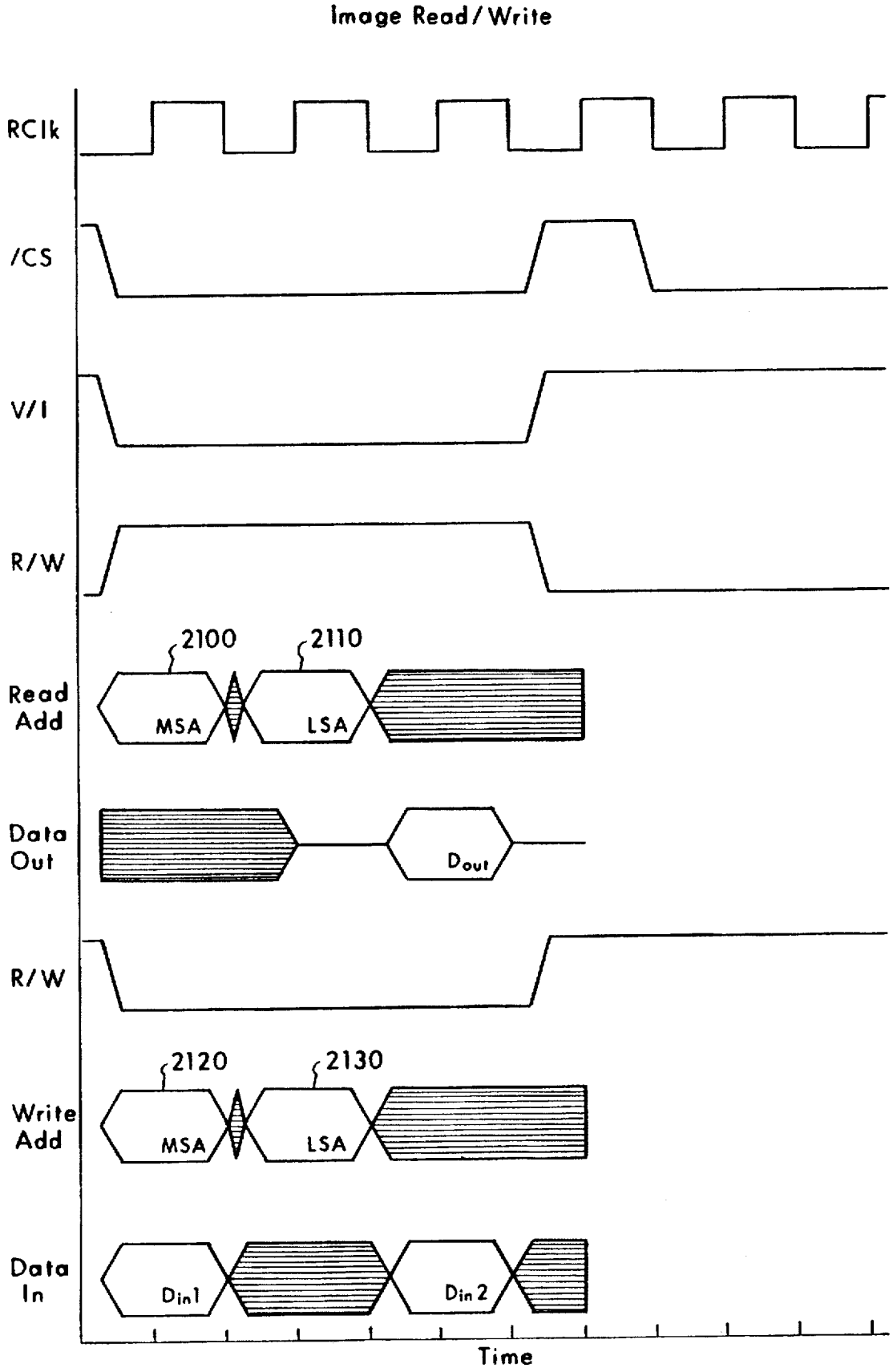
FIG. 21 shows the timing for image read/write.

In the image mode of operation, the MSA and LSA addressee of FIG. 11 are utilized. In FIG. 21, the timing for both image read and image write is shown. Again /CS is properly enabled, and V/I is set low for the image mode. When R/W is set high for read, the read address (MSA 2100 and LSA 2110) Is delivered over bus 100 and the data DOUT is read out over bus 90. When R/W is set low for write, the write address (MSA 2120 and LSA 2130) is delivered over bus 100 and the data Din1+Din2 is delivered to the chip over bus 90. Here, the address and Din1 (i.e., drawing rule and START/STOP) are delivered during the first time interval and Din2 (i.e., source data) is delivered during the second time interval.

Figure 22:
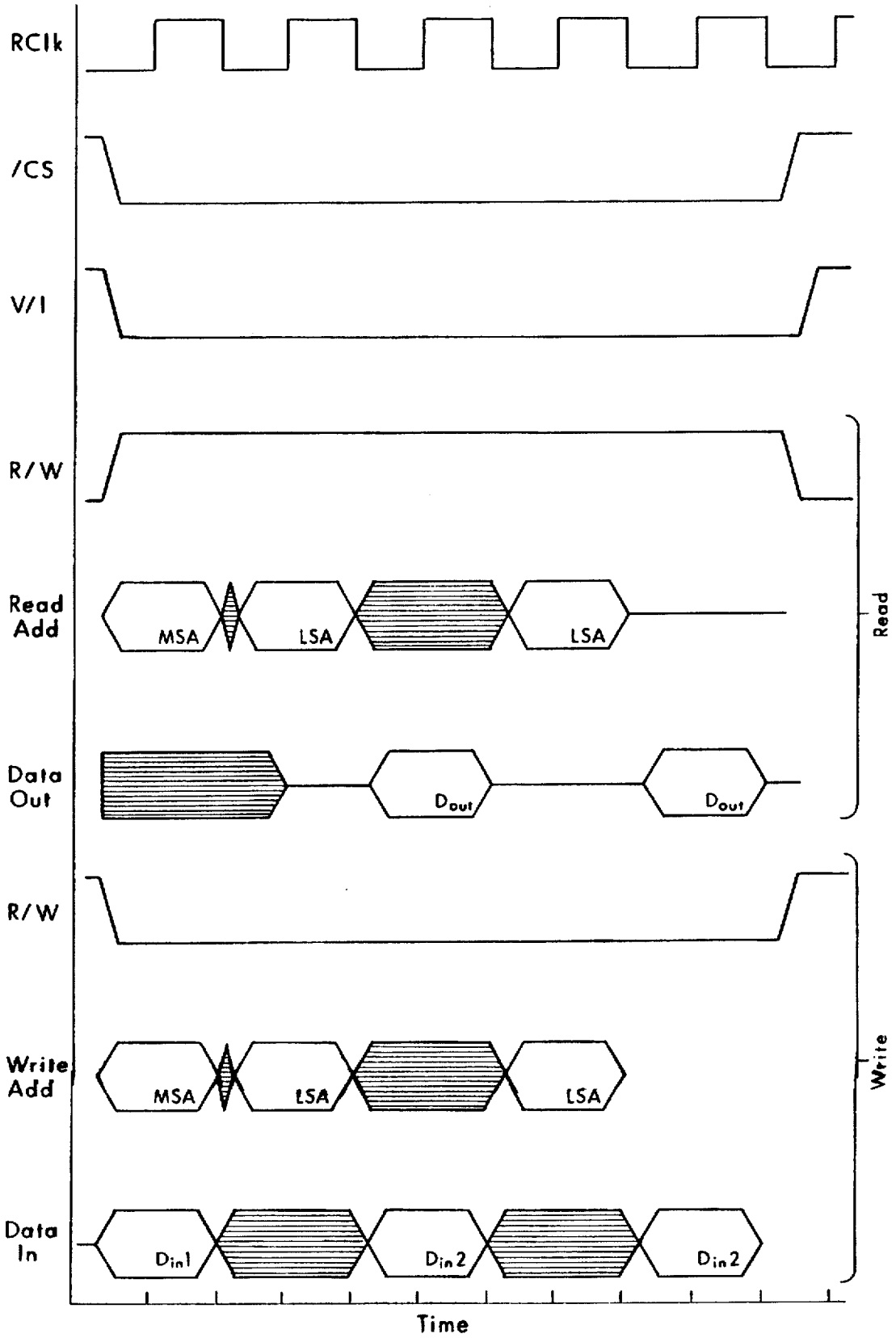
FIG. 22 shows the timing for image read/write, page mode.

FIG. 22 shows the timing for the image read and write in the page mode. In the page mode, the LSA portion of the address changes. Hence, when reading, the changing of LSA causes new data DOUT to be read out. When writing R/W is low, new data is delivered right after delivery of the LSA.

Figure 23:
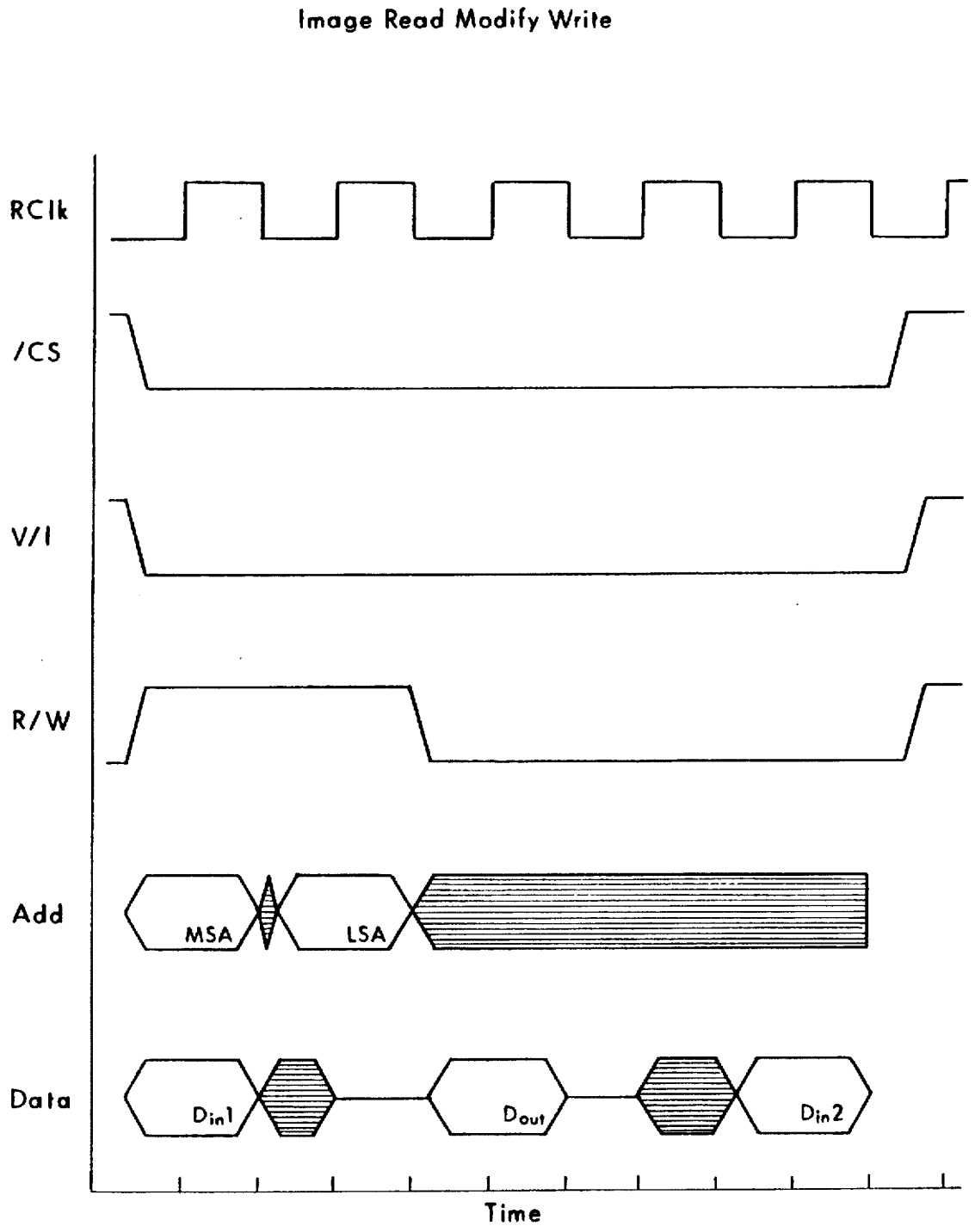
FIG. 23 shows the timing for image read modify write.

Finally, FIG. 23 shows the timing for image read modify write wherein Din1 of FIG. 14 delivers the stat, stop and drawing rule, Dout is the data at the addressed location and Din2 is the SOURCE data to be read into the chips. As before, the MSA and LSA are read into the address register 1320 and the corresponding Din1 and Din2 data configurations FIG. 14 are read into the data register 1340. In image mode of operation, a 16 bit word from a scan line is read from the memory block 1300 and is delivered into the destination latch 1360.

In FIG. 17 is an example of a word called DEST read as OLD information from the memory block 1300. In the image mode operation, source data is delivered on Din2 as shown in FIG. 14 and designated SRC. FIG. 17 shows an example of source data. This 16 bit source data SRC is delivered over lines 1352 into the drawing rule circuit 1354. If a drawing rule such as "exclusive-or" (DR=0110) is utilized, circuit 1354 outputs on leads 1356 the NEW word as shown in FIG. 17. Again, the image mode of operation can have a START and STOP location within the word and for masking purposes. In the example assume START equals 0011 and STOP equals 1000. Hence, the mask circuit 1336 provides write protect WP for the bits indicated as in MASK in FIG. 17. What is written into memory is shown as NEW in FIG. 17. The present invention is capable or performing drawing rule operations on chip in the image mode of operation.

As discussed above and as shown in FIG. 23, the present invention delivers the drawing rule to integrated circuit chip with the delivery of the address during the same time interval and concurrently with the address cycle. This provides a significant speed up over the Hitachi approach which requires a separate time interval in which to deliver the drawing rule.

In the serial data transfer mode of operation, the MSA and LSA addresses of FIG. 4 are utilized and read into the address register 1320. As set forth in TABLE II above, there are no corresponding Din1 or Din2 data words. When these MSA and LSA address words are read in, the appropriate scan line and scan line portion are read from the memory block 1300 into the dynamic latch 1304 as previously discussed.

The random state machine 1366 is of conventional design and based upon the incoming set of control enables (i.e., V/I, R/W, Rfrsh and /CS) delivers, according to the pulses of the single clock Rclk, the following internal random port enable pulses (1) EnMSA and Clk-LSA to enable the reading of the most significant and least significant addresses on address bus 100 into the address register 1320. (2) Clk-Din1 and En-Din2 to read in the data appearing on bus 90 into the data register 1340, (3) DEST to enable the destination latch 1360, (4) PRECH to pre-charge each of the memory blocks 1300 in a conventional fashion, (5) En-DL to enable the dynamic latch 1304 to read in data from the memory block 1300 (6) /WE to enable the WRITE mask 1336 to write protect the memory block 1300 based upon the START and STOP information, (7) ALL to access all of the memory blocks rather than a particular block as specified by the block select portion of the address (this is asserted during all regular and serial data transfer cycles), and (8) the OE signal which enables the output control 1338 to output data onto the data bus 90. While the preferred embodiment uses these internal enables other enables could be used in variations on this approach.

Figure 24:
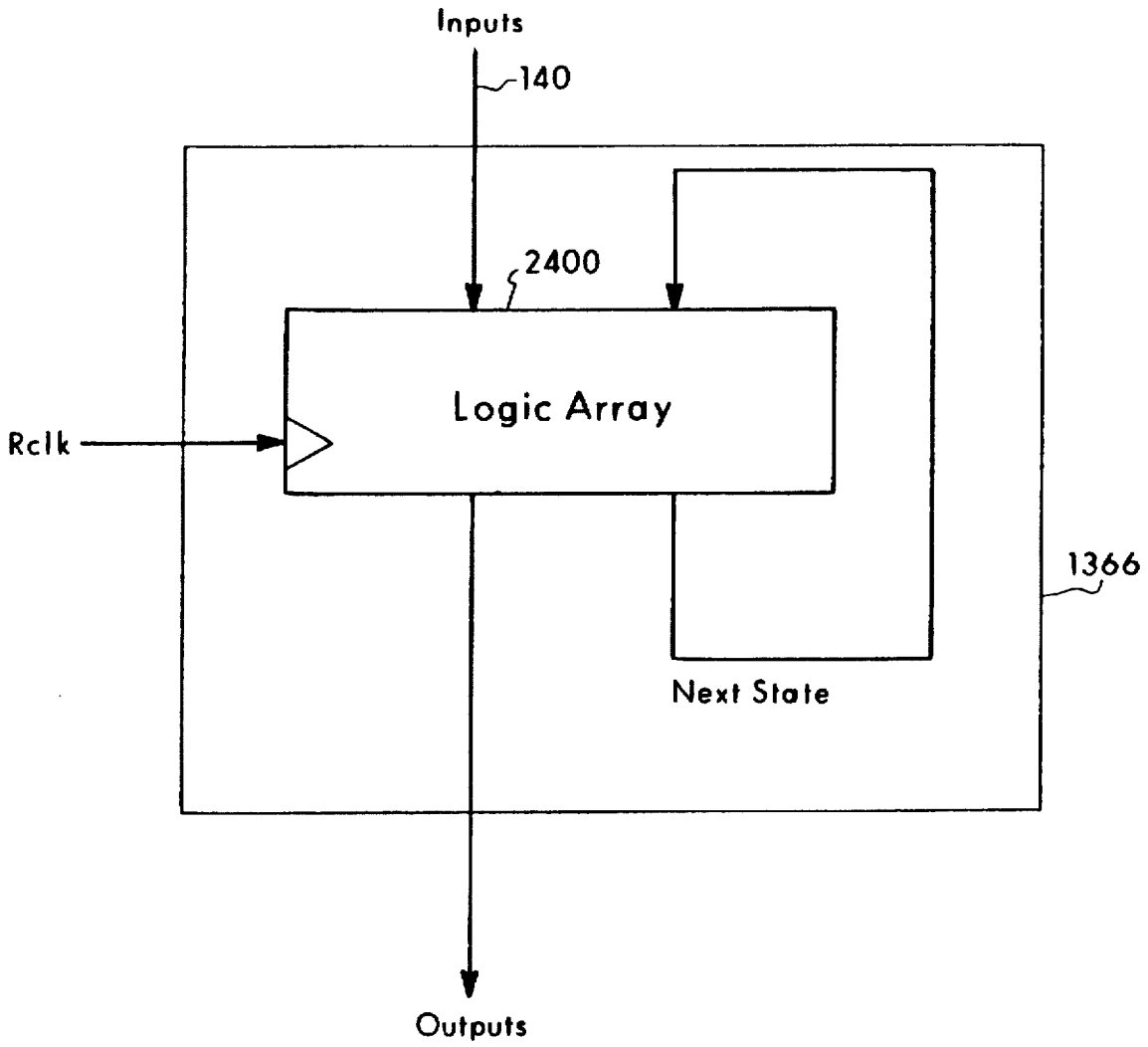
FIG. 24 sets forth an implementation of a random port state machine.

The random port state machine 1366 can comprise, for example, a programmable logic array shown in FIG. 24 wherein the Inputs 140 (i.e., a set of control enables) based upon the use of only a single clock Rclk to generate the outputs set forth above. Internal to the random state machine 1366 is a next state for the logic array 2400. The next state table is set forth as Table IV.

TABLE IV

| Input 3210 | State 3210 | Next State 3210 | Input 3210 | State 3210 | Next State 3210 | Input 3210 | State 3210 | Next State 3210 |
|---|---|---|---|---|---|---|---|---|
| 00xx | 0000 | 0100 | 0101 | 0000 | 1000 | 0111 | 0000 | 0001 |
| 00xx | 0001 | xxxx | 0101 | 0001 | xxxx | 0111 | 0001 | 0011 |
| 00xx | 0010 | xxxx | 0101 | 0010 | xxxx | 0111 | 0010 | 0000 |
| 00xx | 0011 | xxxx | 0101 | 0011 | xxxx | 0111 | 0011 | 0010 |
| 00xx | 0100 | 0110 | 0101 | 0100 | xxxx | 0111 | 0100 | xxxx |
| 00xx | 0101 | xxxx | 0101 | 0101 | xxxx | 0111 | 0101 | xxxx |
| 00xx | 0110 | 0111 | 0101 | 0110 | xxxx | 0111 | 0110 | xxxx |
| 00xx | 0111 | 0000 | 0101 | 0111 | xxxx | 0111 | 0111 | xxxx |
| 00xx | 1000 | xxxx | 0101 | 1000 | 1100 | 0111 | 1000 | xxxx |
| 00xx | 1001 | xxxx | 0101 | 1001 | 1011 | 0111 | 1001 | xxxx |
| 00xx | 1010 | xxxx | 0101 | 1010 | xxxx | 0111 | 1010 | xxxx |
| 00xx | 1011 | xxxx | 0101 | 1011 | 1100 | 0111 | 1011 | xxxx |
| 00xx | 1100 | xxxx | 0101 | 1100 | 1101 | 0111 | 1100 | xxxx |
| 00xx | 1101 | xxxx | 0101 | 1101 | 1100 | 0111 | 1101 | xxxx |
| 00xx | 1110 | xxxx | 0101 | 1110 | xxxx | 0111 | 1110 | xxxx |
| 00xx | 1111 | xxxx | 0101 | 1111 | 1011 | 0111 | 1111 | xxxx |
| 0100 | 0000 | 1000 | 0110 | 0000 | 1000 | 1xxx | 0000 | 0000 |
| 0100 | 0001 | xxxx | 0110 | 0001 | xxxx | 1xxx | 0001 | 0000 |
| 0100 | 0010 | xxxx | 0110 | 0010 | xxxx | 1xxx | 0010 | 0000 |
| 0100 | 0011 | xxxx | 0110 | 0011 | xxxx | 1xxx | 0011 | 0000 |
| 0100 | 0100 | xxxx | 0110 | 0100 | xxxx | 1xxx | 0100 | 0000 |
| 0100 | 0101 | xxxx | 0110 | 0101 | xxxx | 1xxx | 0101 | 0000 |
| 0100 | 0110 | xxxx | 0110 | 0110 | xxxx | 1xxx | 0110 | 0000 |
| 0100 | 0111 | xxxx | 0110 | 0111 | xxxx | 1xxx | 0111 | 0000 |
| 0100 | 1000 | 1001 | 0110 | 1000 | 1001 | 1xxx | 1000 | 0000 |
| 0100 | 1001 | 1011 | 0110 | 1001 | 1011 | 1xxx | 1001 | 0000 |
| 0100 | 1010 | xxxx | 0110 | 1010 | xxxx | 1xxx | 1010 | 0000 |
| 0100 | 1011 | 1001 | 0110 | 1011 | 1111 | 1xxx | 1011 | 0000 |
| 0100 | 1100 | 1101 | 0110 | 1100 | 1101 | 1xxx | 1100 | 0000 |
| 0100 | 1101 | 1001 | 0110 | 1101 | 1001 | 1xxx | 1101 | 0000 |
| 0100 | 1110 | xxxx | 0110 | 1110 | xxxx | 1xxx | 1110 | 0000 |
| 0100 | 1111 | 1011 | 0110 | 1111 | 1011 | 1xxx | 1111 | 0000 |

$Input_3$ N_CS
$Input_2$ N_RFRSH
$Input_1$ V_I
$Input_0$ R_W

In Table IV the input set format is: /CS, Rfrsh, V/I, and R/W. As can be seen above for each different set of enables (INPUT) from the control bus 140, the random state machine produces a predetermined sequence as derived from the clock (Rclk) signal of the state table (STATE) to produce the control pulses which are defined next.

The output STATE signals are decoded from the state and are set forth in Table V.

TABLE V

| State | Output | | | | | | | | | | |
|---|---|---|---|---|---|---|---|---|---|---|---|
| 3210 | 10 | 9 | 8 | 7 | 6 | 5 | 4 | 3 | 2 | 1 | 0 |
| 0000 | 1 | 1 | x | x | x | x | 1 | 1 | 0 | 1 | 0 |
| 0001 | 0 | 0 | 0 | 0 | x | x | 1 | 1 | 1 | 1 | 0 |
| 0010 | 0 | 0 | x | x | x | x | 1 | 1 | 1 | 1 | 0 |
| 0011 | 0 | 0 | 1 | 1 | x | x | 1 | 1 | 1 | 1 | 1 |
| 0100 | 0 | x | x | x | x | x | 1 | 1 | 1 | 0 | 0 |
| 0101 | x | x | x | x | x | x | x | 1 | x | x | x |
| 0110 | 0 | x | x | x | x | x | 1 | 1 | 1 | 0 | 0 |
| 0111 | 0 | x | x | x | x | x | 1 | 1 | 1 | 0 | 0 |
| 1000 | 0 | 0 | 0 | 1 | x | x | 1 | 1 | 0 | 1 | 0 |
| 1001 | 0 | 0 | 1 | 0 | 1 | 1 | 1 | 1 | 0 | 1 | 0 |
| 1010 | x | x | x | x | x | x | x | 1 | x | x | x |
| 1011 | 0 | 0 | 0 | 0 | 0 | 0 | 0 | 1 | 0 | 1 | 0 |
| 1100 | 0 | 0 | 1 | 0 | x | x | 1 | 0 | 0 | 1 | 0 |
| 1101 | 0 | 0 | 0 | 0 | x | x | 1 | 1 | 0 | 1 | 0 |
| 1110 | x | x | x | x | x | x | x | 1 | x | x | x |
| 1111 | 0 | 0 | 1 | 1 | x | 1 | 1 | 1 | 0 | 1 | 0 |

The output relationships are set forth in Table VI.

TABLE VI

| | |
|---|---|
| $Output_{10}$ | PRECHARO |
| $Output_9$ | EN_MSA |
| $Output_8$ | CLK_LSA |
| $Output_7$ | CLK_DIN1 |
| $Output_6$ | EN_DIN2 |
| $Output_5$ | EN_DEST |
| $Output_4$ | N_WE |
| $Output_3$ | N_OE |
| $Output_2$ | ALL |
| $Output_1$ | N_IRFRSH |
| $Output_0$ | EN_DL |

The random port control signals set forth in Table VI become valid in the random port 1200, as shown in FIGS. 18 through 23 with the edges of the clock Rclk.

It can clearly be seen based upon this disclosure only a single clock pulse Rclk controls the random port 1200 of the present invention. In other words, the random port 1200 of the present invention receives a set of control signals (i.e., INPUT of Table IV). Each set corresponding to a different mode of operation for the random port. The random state machine 1366 provides the sequential configuration (i.e., STATE and NEXT STATE of Table IV) for the received set. Each different set has a different sequential configuration resulting in its own predetermined sequence of internal control pulses (i.e., Table V). The single random port clock provides the timing signal necessary for executing the configured sequence of internal control pulses so that the random port operates in the mode of operation corresponding to the received set of control signals. It is to be expressly understood that while a preferred approach is set forth in Tables IV, V, and VI that other configurations of control signals and states can be defined under the teachings of the present invention to work on the provision of a single random port clock which in the present embodiment is 16.7 MHz.

Combining the aforesaid state tables with the timing diagrams of FIGS. 19 through 23, the method of modifying the stored information in the memory is based upon a series of time intervals which are derived from the single random clock Rclk. During a first time interval the vector or image address as well as the drawing rule and the START and STOP locations are delivered to the chip. Based upon the set of control enables the Rclk then sequences through the appropriate state table. Hence, during a second time interval the addressed information is delivered from memory and the source data is delivered to the chip. During a third interval the delivered information (i.e., DEST in FIGS. 16 and 17 is modified with the source data (i.e., SRC or FIGS. 16 and 17) based upon the drawing rule (i.e., Table III). During a fourth time interval the modified information (i.e., NEW of FIGS. 16 and 17) is written between the START and STOP bit locations (i.e., MASK of FIGS. 16 and 17) into memory. Variations to this method are possible under the teachings of the present invention.

It is to be expressly understood that the preferred embodiment illustrates certain bit fields and patterns certain pin configurations and layouts; however, the present invention is not so limited that under the teachings of the present invention other embodiments could be used.

While preferred embodiments of the present invention have been shown, it is to be expressly understood that modifications and changes may be made thereto and that the present invention is set forth in the following claims.

We claim:

1. An improved random port (1200) for a dynamic random access memory (1300) which stores a plurality of lines or information, said random port and said dynamic random access memory being on a single integrated circuit chip (10), said random port being connected to an address bus (100), a data bus (90) and a control but (140), said control bus delivering a read/write (R/W) signal over a single input to said integrated circuit chip, said address bus delivering the address of a line or stored information in said system, said data bus delivering source data for updating said line of stored information and the drawing rule used to update the bits in said line of stored information with said source data, said improved random port comprising:

said dynamic random access memory being capable of being addressed with vector/image addresses, said control bus delivering a vector/image control signal (V/I) to identify the type of said address on said address bus, and said control bus delivering a clock signal over a single input to said integrated circuit chip, address means 1320 connected to said address bus for receiving said vector/image address of stored information in said dynamic random access memory, source means (1340) connected to said data bus for receiving source data and said drawing rule, output means (1338) connected to said dynamic random access memory for delivering said stored information at said vector/image address from said memory to said data bus, modification means (1336, 1354 and 1360) connected to said dynamic random access memory and obtaining said stored information therefrom and connected to said source means for obtaining both said source data and said drawing rule from said data bus therefrom for (a) updating said stored information with said source data and (b) for writing said modified information back into said dynamic random access memory, and control means (1366) connected to said control bus for receiving said clock signal and said vector/image control signal from said control bus and being further connected to said address means, said source means, said output means, said modification means, and said dynamic random access memory; said control means being responsive to the receipt of said clock signal and said vector/image and read/write signals for controlling the operation of said address means, said source means, said output means, said modification means, and said dynamic random access memory.

2. The improved random port of claim 1 wherein said control means is a dynamic random state machine said dynamic random state machine being responsive to said vector/image and read/write signals for producing predetermined sequences of internal control pulses derived from said clock signal.

3. The improved random port of claim 1 wherein said source means operative with said clock signal further receives said drawing rule from said data bus, said drawing rule being the logical operation for modifying said addressed stored information and said source data being the inputted data used to perform said modification, said source means further receiving from said data bus START and STOP locations for modifying said addressed stored information, said START and STOP locations being beginning and ending bit locations in said addressed stored information between which said modification occurs, and wherein said modification means comprises:

(a) means (1360) under control of said clock signal and connected to said memory for holding said stored information from said memory based upon said address in said address means, (b) drawing rule means (1354) under control of said clock signal and connected to said holding means for obtaining said addressed stored information and connected to said data means for obtaining said drawing rule, said drawing rule means logically combining said addressed stored information with said source data according to said drawing rule logical operation to modify said addressed stored information, and (c) write mask means (1336) under control or clock signal and connected to said source means for obtaining said START and STOP locations and connected to said memory for allowing said writing of said logical combination only between said START and STOP bit locations of said stored information.

4. An improved random port (1200) for a dynamic random access memory (1300) which stores a plurality of lines of information said random port and said dynamic random access memory being on a single integrated circuit chip (10), said random port being connected to an address bus (100), a data bus (90) and a control bus (140), said control bus delivering a read/write (R/W) signal over a single input to said integrated circuit chip, said address bus delivering the address of a line of stored information in said system, said data bus delivering source data for updating said line of stored information and the drawing rule used to update the bits in said line of stored information with said source data, said improved random port comprising:

said dynamic random access memory being capable of storing at least one million bits and being addressed with vector/image addresses, said control bus delivering a vector/image control signal (V/I) to identify the type of said address on said address bus, and said control bus delivering a clock signal of at least one megahertz over a single input to said integrated circuit chip, address means 1320 connected to said address bus for receiving said vector/image address of stored information in said dynamic random access memory, source means (1340) connected to said data bus for receiving source data and said drawing rule, source means (1338) connected to said dynamic random access memory for delivering said stored information at said vector/image address from said memory to said data bus, modification means (1336, 1354 and 1360) connected to said dynamic random access memory and obtaining said stored information therefrom and connected to said source means for obtaining both said source data and said drawing rule from said data bus therefrom for (a) updating said stored information with said source data and (b) for writing said modified information back into said dynamic random access memory, and a state machine (1366) connected to said control bus for receiving said clock signal and said vector/image control signal from said control bus and being further connected to said address means, said source means, said output means said modification means, and said dynamic random access memory; said state machine being responsive to the receipt of said clock signal and said vector/image and read/write signals for controlling the operation of said address means, said source means, said output means, said modification means, and said dynamic random access memory.

*5. An improved random port for a dynamic random access memory which includes a plurality of memory cells for storing information, said random port and said dynamic random access memory being on a single integrated circuit chip, said random port being connectable to an address bus, a data bus, and a control bus including an external clock signal, said improved random port comprising:*

*address means connected to said address bus for holding a first address of information stored in said dynamic random access memory in response to a first edge of said external clock signal, and for holding a second address of said information stored in said dynamic random access memory in response to a second edge of said external clock signal, said first edge of said external clock signal being different from said second edge said external clock signal;*

*output means connected to said dynamic random access memory for delivering said stored information at said first and second addresses from said memory to said data bus; and*

*control means connected to said control bus for receiving said external clock signal from said control bus and being further connected to said address means, said output means and said dynamic random access memory, said control means being responsive to the receipt of said external clock signal for controlling the operation of said address means, said output means, and said dynamic random access memory.*

*6. The improved random port of claim 5, wherein said control means is a dynamic random state machine responsive to a control input provided on said control bus for producing predetermined sequences of internal control pulses in synchronization with said external clock signal.*

*7. The improved random port of claim 5, further comprising:*

*data input means connected to said data bus for receiving data and for holding said data in response to an edge of said external clock signal; and*

*writing means for writing said held data to said memory.*

*8. A synchronous dynamic random access memory, comprising:*

*a memory block residing on an integrated circuit chip and including a plurality of memory cells for storing information; and*

*a random port residing on said integrated circuit chip and connectable to an address bus, a data bus, and a control bus including an external clock signal, said random port including:*

*address means connected to said address bus for holding a first address of information stored in said dynamic random access memory in response to a first edge of said external clock signal and for holding a second address of said information stored in said dynamic random access memory in response to a second edge of said external clock signal, said first edge of said external clock sign b different from said second edge of said external clock signal;*

*output means connected to said dynamic random access memory for delivering said stored information at said first and second addresses from said memory block to said data bus; and*

*control means connected to said control bus for receiving said external clock signal from said control bus and being further connected to said address means, said output means and said dynamic random access memory, said control means being responsive to the receipt of said external clock signal for controlling the operation of said address means, said output means, and said memory block.*

*9. The memory of claim 8, wherein said control means is a dynamic random state machine responsive to a control input provided on said control bus for producing predetermined sequences of internal control pulses in synchronization with said external clock signal.*

*10. A synchronous dynamic random access memory integrated circuit comprising:*

*a memory block including a plurality of memory cells for storing information;*

*an input for receiving an external clock signal;*

*address input means for receiving a first address and a second address defining a location of information stored in said memory block, said address input means providing said first address as an output in response to a first edge of said external clock signal, said address input means providing said second address as an output in response to a second edge of said external clock signal, said first edge of said external clock signal being different from said second edge of said external clock signal; and*

*access means for accessing a location in said memory block corresponding to said first address and said second address provided by said address input means.*

*11. The memory of claim 10, wherein said access means comprises output means for outputting information stored at said location of said memory block in response to a third edge of said external clock signal.*

*12. The memory of claim 10, further comprising:*

*mask information input means for receiving mask information, said mask information input means providing said mask information as an output in response to a third edge of said external clock signal, and*

*wherein said access means comprises:*

*write mask means for generating a write prohibition signal for prohibiting writing information to at least one bit location in said memory block based on said mask information; and*

*write means for writing said information to said memory block in accordance with said write prohibition signal within a region in said memory block corresponding to said first address and said second address provided by said address input means.*

*13. The memory of claim 12, wherein a number of bits in said mask information is less than a number of bits in said at least one bit location.*

*14. The memory of claim 12, wherein said mask information includes information for prohibiting writing by said write means at a lower bit portion having at least one bit which is lower than a predetermined bit.*

*15. The memory of claim 12, wherein said mask information includes information for prohibiting writing by said write means at a higher bit portion having at least one bit which is higher than a predetermined bit.*

*16. The memory of claim 12, wherein said write means writes said information to said memory block in response to a fourth edge of said external clock signal.*

*17. The memory of claim 11, further comprising:*

*control means for supplying a first enable signal and a second enable signal to said address input means in response to an external control input on an edge of said external clock signal, and for supplying an output enable signal to said output means in response to said external control input on an edge of said external clock signal, each of said first enable signal, said second enable signal and said output enable signal being synchronous with an edge of said external clock signal,*

*wherein said address input means provides said first address in response to said first enable signal, said address input means provides said second address in response to said second enable signal, and said output means outputs said information in response to said output enable signal.*

*18. The memory of claim 10, wherein said access means comprising:*

*data input means for receiving data, said data input means providing said data as an output in response to an edge of said external clock signal; and*

*write means for writing said data to said memory block at a location addressed by said first address and said second address in response to an edge of said external clock signal.*

*19. The memory of claim 18, further comprising:*

*control means for supplying a data enable signal to said data input means in response to an external control input on an edge of said external clock signal, and for supplying a write enable signal to said write means in response to said external control input on an edge of said external clock signal, each of said data enable signal and said write enable signal being synchronous with an edge of said external clock signal,*

*wherein said data input means provides said data in response to said data enable signal, and said write means writes said data in response to said write enable signal.*

*20. The memory of claim 10, wherein said external clock signal has a frequency of about 16.7 MHz.*

*21. The memory of claim 10, further comprising:*

*a serial port, including:*

*means for receiving a serial port clock signal for controlling timing of said serial port;*

*serial output means; and*

*transfer means for transferring serial information stored in said memory block to said serial output means in response to a third edge of said external clock signal;*

*wherein said serial output means sequentially outputs portions of said serial information in response to respective edges of said serial port clock signal.*

*22. The memory of claim 21, further comprising:*

*control means for supplying a first enable signal and a second enable signal to said address input means in*

*response to an external control input on an edge of said external clock signal, and for supplying a transfer enable signal to said transfer means in response to said external control input on an edge of said external control input, each of said first enable signal, said second enable signal, and said transfer enable signal being synchronous with an edge of said external clock signal,*

*wherein said address input means provides said first address in response to said first enable signal, said address input means provides said second address in response to said second enable signal, and said transfer means transfers said serial information in response to said transfer enable signal.*

*23. A synchronous dynamic random access memory integrated circuit comprising:*

*a memory block including a plurality of memory cells for storing information;*

*can input for receiving an external clock signal;*

*address input means for receiving a first address and a second address defining a location of information stored in said memory block, said address input means providing said first address as an output in response to a first enable signal, and said address input means providing said second address as an output in response to a second enable signal;*

*access means for accessing a location in said memory block corresponding to said first address and said second address provided by said address input means;*

*control means for supplying said first enable signal and said second enable signal to said address input means in response to an external control input on an edge of said external clock signal, and for supplying said output enable signal to said output means in response to said external control input on an edge of said external clock signal, each of said first enable signal, said second enable signal and said output enable signal being synchronous with an edge of said external clock signal.*

*24. The memory of claim 23, wherein said access means comprises:*

*data input means for receiving data, said data input means providing said data as an output in response to a data enable signal,*

*write means for writing said data to said memory block at a location addressed by said first address and said second address in response to a write enable signal,*

*wherein said control means supplies said data enable signal to said data input means in response to said external control input on an edge of said external clock signal, and supplies said write enable signal to said write means in response to said external control input on an edge of said external clock signal, each of said data enable signal and said write enable signal being synchronous with an edge of said external clock signal.*

*25. The memory of claim 24, wherein each of said data enable signal and said write enable signal is in one of a first state and a second state.*

*26. The memory of claim 24, wherein*

*said control means comprises:*

*means for determining a next state in response to a current state and said external control input on an edge of said external clock signal; and*

*means for producing said first enable signal, said second enable signal, said output enable signal, said data enable signal and said write enable signal as a function of said next state.*

*27. The memory of claim 23, wherein*

*said control means comprises:*

*means for determining a next state in response to a current state and said external control input on an edge of said external clock signal; and*

*means for producing said first enable signal, said second enable signal and said output enable signal as a function of said next state.*

*28. The memory of claim 23, wherein said external clock signal has a frequency of about 16.7 MHz.*

*29. The memory of claim 23, wherein said access means comprises output means for outputting information stored at said location of said memory block in response to an output enable signal.*

*30. The memory of claim 29, wherein each of said first enable signal, said second enable signal and said output enable signal is in one of a first state and a second state.*

*31. In a synchronous memory integrated circuit including a memory block having a plurality of memory cells for storing information; address input means for receiving a first address and a second address defining a location of information stored in said memory block: output means for outputting information from said memory block; and an input for receiving an external clock signal,*

*a method for reading information from said memory block, comprising the steps of:*

*a) providing said first address as an output of said address input means in response to a first edge of said external clock signal;*

*b) providing said second address as an output of said address input means in response to a second edge of said external clock signal, said first edge of said external clock signal being different from said second edge of said external clock signal; and*

*c) outputting information stored at a location of said memory block addressed by said first address and said second address on a third edge of said external clock signal.*

*32. The method of claim 31, further comprising the step of repeating steps of b and c.*

*33. In a synchronous memory integrated circuit including a memory block having a plurality of memory cells for storing information; address input means for receiving a first address and a second address defining a location of information stored in said memory block; data input means for receiving data; write means for writing said data into said memory block; and an input for receiving an external clock signal,*

*a method for writing data into said memory block, comprising the steps of:*

*a) providing said first address as an output of said address input means in response to a first edge of said external clock signal;*

*b) providing said second address as an output of said address input means in response to a second edge of said external clock signal, said first edge of said external clock signal being different from said second edge of said external clock signal;*

*c) providing said data as an output of said data input means in response to an edge of said external clock signal; and*

*d) writing said data into said memory block at a location addressed by said first address and said second address on an edge of said external clock signal.*

*34. The method of claim 33, further comprising the step, of repeating steps of b and d.*

*35. In a synchronous memory integrated circuit including a memory block having a plurality of memory cells for storing information; address input means for receiving a first address and a second address defining a location of information stored in said memory block; output means for outputting information from said memory block; data input means for receiving data: write means for writing said data into said memory block; and an input for receiving an external clock signal,*

*a method for reading and writing information from said memory block, comprising the steps of:*

*a) providing said first address as an output of said address input means to response to a first edge of said external clock signal;*

*b) providing said second address as an output of said address input means in response to a second edge of said external clock signal, said first edge of said external clock signal being different from said second edge of said external clock signal;*

*c) outputting information stored at a location of said memory block addressed by said first address and said second address on a third edge of said external clock signal;*

*d) providing said data as an output of said data input means in response to an edge of said external clock signal; and*

*e) writing said data into said memory block at said location addressed by said first address and said second address on an edge of said external clock signal.*

*36. A synchronous dynamic random access memory integrated circuit, comprising:*

*an input for receiving an external clock signal;*

*a memory block;*

*an address buffer in which an address from a first address and a second address bus are loaded in response to a first load enable signal and a second load enable signal, respectively, said first address and said second address representing an addressable memory location in said memory block;*

*means for reading information stored at said addressable memory location;*

*means for outputting said information read from said memory to a data bus in response to an output enable signal; and*

*a digital control circuit for controlling said address buffer and said means for outputting, said control circuit comprising logic clocked by said external clock signal during a read operation to generate said first and second load enable signals in response to an edge of respective clock cycles in said external clock signal, and to generate said output enable signal in response to a subsequent edge of a clock cycle in said external clock signal.*

*37. The memory of claim 36, wherein said edges occur in consecutive clock cycles.*

*38. The memory of claim 36, further comprising:*

*a data buffer in which data from a data bus is loaded in response to a data load enable signal;*

*means for writing said data loaded in said data buffer to said addressable memory location represented by said address loaded in said address buffer; and*

*wherein said control circuit logic during a write operation generates said first and second load enable signals in response to an edge of respective clock cycles in said external clock signal, and generates said data load enable signal in response to an edge of a clock cycle in said external clock signal.*

*39. The memory of claim 38, wherein at least one of said first and second load enable signals and said data load enable signal are generated concurrently in response to the same edge.*

*40. A synchronous dynamic random access memory integrated circuit connected to a first bus for specifying a location in said memory block and for inputting/outputting data, and a second bus for inputting an external control input defining an operation mode, comprising:*

*a memory block including a plurality of memory cells for storing information;*

*an input for receiving an external clock signal;*

*address input means for receiving a first address and a second address through said first bus, said address input means providing said first address as an output in response to a first edge of said external clock signal, said address input means providing said second address as an output in response to a second edge of said external clock signal, said first edge of said external clock signal being different from said second edge of said external clock signal;*

*access information input means for receiving access information through said first bus, said access information defining a specification of said operation mode in combination with said external control input defining said operation mode, said access information input means providing said access information as an output in response to a third edge of said external clock signal;*

*access means for accessing a location in said memory block corresponding to said first address and said second address provided by said address input means in accordance with said operation mode and;*

*control means for receiving said external control input defining said operation mode through said second bus, and for controlling operations of said address input means, said access information input means and said access means in response to said external control input on an edge of said external clock signal.*

*41. The memory of claim 40, wherein said access means comprises:*

*write means for writing information to said memory block at a location corresponding to said first and said second address in response to a fourth edge of said external clock signal.*

*42. The memory of claim 41,*

*wherein said control means supplies a first enable signal and a second enable signal to said address input means in response to an external control input on an edge of said external clock signal, supplies an access information enable signal to said access information input means in response to said external control input on an edge of said external clock signal, and supplies a write enable signal to said write means in response to said external control input on an edge of said external clock signal, each of said first enable signal, said second enable signal, said access information enable signal and said write enable signal being synchronous with an edge of said external clock signal, and*

*wherein said address input means provides said first address in response to said first enable signal, said address input means provides said second address in response to said second enable signal, said access*

*information input means provides said access information in response to said access information enable signal, and said write means writes said information in response to said write enable signal.*

*43. The memory of claim 40, further comprising:*

*a serial port, including:*

*means for receiving a serial port clock signal for controlling timing of said serial port;*

*serial output means; and*

*transfer means for transferring serial information stored in said memory block to said serial output means in response to a fourth edge of said external clock signal;*

*wherein said serial output means sequentially outputs portions of said serial information in response to respective edges of said serial port clock signal.*

*44. The memory of claim 43,*

*wherein said control means supplies a first enable signal and a second enable signal to said address input means in response to an external control input on an edge of said external clock signal, and supplies a transfer enable signal to said transfer means in response to said external control input on an edge of said external clock signal, each of said first enable signal, said second enable signal and said transfer enable signal being synchronous with an edge of said external clock signal, and*

*wherein said address input means provides said first address in response to said first enable signal, said address input means provides said second address in response to said second enable signal, and said transfer means transfers said serial information in response to said transfer enable signal.*

*45. A synchronous dynamic random access memory integrated circuit which operates by use of edges of an external clock signal, said memory comprising:*

*a memory block including a plurality of memory cells for storing information;*

*an input for receiving said external clock signal;*

*address input means for receiving a first address and a second address, said address input means providing said first address as an output in response to a first edge of said external clock signal, said address input means providing said second address as an output in response to a second edge of said external clock signal, said first edge of said external clock signal being different from said second edge of said external clock signal;*

*access means for accessing a location in said memory block corresponding to said first address and said second address provided by said address input means; and*

*control means for receiving an external control input indicating a read/write mode defining one of a read mode and a write mode, and for changing said read/write mode based on a difference of level of said external control input at two successive edges of said edges of said external clock signal.*

*46. The memory of claim 45, wherein:*

*said first address provided by said address input means is maintained before and after a level change of said external control input resulting in the difference of level.*

*47. The memory of claim 45, wherein said access means comprises:*

*output means for outputting information stored at said location of said memory block in response to a third edge of said external clock signal.*

*48. The memory of claim 47,*

*wherein said control means supplies a first enable signal and a second enable signal to said address input means in response to said external control input on an edge of said external clock signal, and supplies an output enable signal to said output means in response to said external control input on an edge of said external clock signal, each of said first enable signal, said second enable signal and said output enable signal being synchronous with an edge of said external clock signal, and*

*wherein said address input means provides said first address in response to said first enable signal, said address input means provides said second address in response to said second enable signal, and said output means outputs said information in response to said output enable signal.*

*49. The memory of claim 45, wherein said access means comprises:*

*data input means for receiving data, said data input means providing said data as an output in response to a third edge of said external clock signal; and*

*write means for writing said data to said memory block at a location corresponding to said first and said second address in response to a fourth edge of said external clock signal.*

*50. The memory of claim 49,*

*wherein said control means supplies a data enable signal to said data input means in response to said external control input on an edge of said external clock signal, and supplies a write enable signal to said write means in response to said external control input on an edge of said external clock signal, each of said data enable signal and said write enable signal being synchronous with an edge of said external clock signal,*

*wherein said data input means provides said data in response to said data enable signal, and said write means writes said data in response to said write enable signal.*

*51. The memory of claim 45, further comprising:*

*a serial port, including:*

*means for receiving a serial port clock signal for controlling timing of said serial port;*

*serial output means; and*

*transfer means for transferring serial information stored in said memory block to said serial output means in response to a third edge of said external clock signal;*

*wherein said serial output means sequentially outputs portions of said serial information in response to respective edges of said serial port clock signal.*

*52. The memory of claim 51,*

*wherein said control means supplies a first enable signal and a second enable signal to said address input means in response to said external control input on an edge of said external clock signal, and supplies a transfer enable signal to said transfer means in response to said external control input on an edge of said external clock signal, each of said first enable signal, said second enable signal and said transfer enable signal being synchronous with an edge of said external clock signal, and*

*wherein said address input means provides said first address in response to said first enable signal, said address input means provides said second address in response to said second enable signal, and said trans-*

*fer means transfers said serial information in response to said transfer enable signal.*

*53. A synchronous semiconductor memory integrated circuit comprising:*

*a memory block including a plurality of memory cells for storing information;*

*an input for receiving an external clock signal;*

*address input means for receiving a first address and a second address, said address input means providing said first address as an output in response to an edge of said external clock signal, said address input means providing said second address as an output in response to an edge of said external clock signal;*

*access means for accessing a location in said memory block corresponding to said first address and said second address provided by said address input means and;*

*control means for outputting an internal control signal defining a timing of an internal operation of said synchronous semiconductor memory in response to an external control input on an edge of said external clock signal;*

*wherein said control means generates new state information in accordance with an external control input and state information output in response to a first edge of said external clock signal, and outputs a new internal control signal based on said new state information in response to a second edge of said external clock signal, said first edge of said external clock signal being different from said second edge of said external clock signal.*

*54. The memory of claim 53, wherein said external control input is on said second edge of said external clock signal.*

*55. The memory of claim 54, wherein said control means generates further new state information in accordance with an external control input on a third edge of said external clock signal and said new state information, and outputs a further new internal control signal based on said further new state information in response to said third edge of said external, clock signal, said second edge of said external clock signal being different from said third edge of said external clock signal.*

*56. The memory of claim 53, wherein said second edge of said external clock signal is the next edge to said first edge of said external clock signal.*

*57. The memory of claim 53, wherein a first enable signal and a second enable signal are included in different internal control signals, said address input means provides said first address in response to said first enable signal, and said address input means provides said second address in response to said second enable signal.*

*58. The memory of claim 53, wherein:*

*said internal control signal is a precharge control signal provided to said memory block.*

*59. The memory of claim 53, wherein said access means comprises:*

*output means for outputting information stored at said location of said memory block in response to a third edge of said external clock signal.*

*60. The memory of claim 59, wherein a first enable signal, a second enable signal and an output enable signal are included in different internal control signals, said address input means provides said first address in response to said first enable signal, said address input means provides said second address in response to said second enable signal, and said output means outputs said information in response to said output enable signal.*

*61. The memory of claim 53, wherein said access means comprises:*

*data input means for receiving data, said data input means providing said data as an output in response to a third edge of said external clock signal; and*

*write means for writing said data to said memory block at a location corresponding to said first and said second address in response to a fourth edge of said external clock signal.*

*62. The memory of claim 61, wherein a data enable signal and a write enable signal are included in different internal control signals, said data input means provides said data in response to said data enable signal, and said write means writes said data in response to said write enable signal.*

*63. The memory of claim 53, further comprising:*

*a serial port, including:*

*means for receiving a serial port clock signal for controlling timing of said serial port;*

*serial output means; and*

*transfer means for transferring serial information stored in said memory block to said serial output means in response to a third edge of said external clock signal;*

*wherein said serial output means sequentially outputs portions of said serial information in response to respective edges of said serial port clock signal.*

*64. The memory of claim 63, wherein a first enable signal, a second enable signal and a transfer enable signal are included in different internal control signals, said address input means provides said first address in response to said first enable signal, said address input means provides said second address in response to said second enable signal, and said transfer means transfers said serial information in response to said transfer enable signal.*

*65. The memory of claim 53, wherein said state information may be any one of a first state information indicating an initial state and a plurality of second state information indicating respective states other than said initial state, and with respect to at least one of the plurality of second state information when said state information output in response to said first edge of said external clock signal is said at least one second state information, said new state information may be any one of a predefined plurality of second state information from among said plurality of second state information, each of said predefined plurality of second state information indicating respective states other than said initial state.*

*66. A synchronous dynamic random access memory integrated circuit*

*a plurality of memory blocks including a plurality of memory cells for storing information;*

*an input for receiving an external clock input;*

*address input means for receiving a first address and a second address, said address input means providing said first address as an output in response to a first edge of said external clock input, said address input means providing said second address as an output in response to a second edge of said external clock input, said first edge of said external clock input being different from said second edge of said external clock input; and*

*output means for sequentially outputting a plurality of data which belong to separately addressable locations in said memory blocks at substantially a same interval, said plurality of data including data stored at a location in said memory blocks corresponding to said first address and said second address provided by said address input means.*

*67. The memory of claim 66, wherein:*

*prior to completing outputs of a plurality of data which belong to a first separately addressable location, a plurality of data which belong to a second separately addressable location and which are stored in said memory cells of said memory blocks are accessed, said first separately addressable location being different from said second separately addressable location.*

*68. A synchronous dynamic random access memory integrated circuit comprising:*

*a memory block including a plurality of memory cells for storing information;*

*an input for receiving an external clock signal;*

*address input means for receiving a first address and a second address, said address input means providing said first address as an output in response to a first enable signal, said address input means providing said second address as an output in response to a second enable signal;*

*access means for accessing a location in said memory block corresponding to said first address and said second address provided by said address input means in response to a third enable signal; and*

*control means for receiving a first external control input indicating one of a read mode and a write mode and a second external control input which is different from said first external control input, for generating said third enable signal based on said first external control input and generating at least one of said first enable signal and said second enable signal based on said second external control input, and for supplying said third enable signal to said access means in response to an edge of said external clock signal and supplying at least one of said first enable signal and said second enable signal to said address input means in response to an edge of said external clock signal.*

*69. A synchronous dynamic random access memory integrated circuit which operates by use of edges of an external clock signal, said memory comprising:*

*a memory block including a plurality of memory cells for storing information;*

*an input for receiving an external clock signal;*

*address input means for receiving a first address and a second address, said address input means providing said first address as an output in response to a first edge of said external clock signal, said address input means providing said second address as an output in response to a second edge of said external clock signal, said first edge of said external clock signal being different from said second edge of said external clock signal;*

*access means for accessing a location in said memory block corresponding to said first address and said second address provided by said address input means;*

*control means for receiving an external control input indicating whether or not a precharge operation is performed, and for changing whether said precharge operation is performed based on a difference of level of said external control input at two successive edges of said edges of said external clock signal.*

*70. The memory of claim 69, wherein said external control input serves as a signal indicating whether or not an access to said memory block is performed.*

*71. A synchronous semiconductor memory integrated circuit comprising:*

*a memory block including a plurality of memory cells for storing information;*

*an input for receiving an external clock signal;*

*address input means for receiving a first address and a second address, said address input means providing said first address as an output in response to an edge of said external clock signal, said address input means providing said second address as an output in response to an edge of said external clock signal;*

*access means for accessing a location in said memory block corresponding to said first address and said second address provided by said address input means; and*

*control means for outputting an internal control signal defining a timing of an internal operation of said synchronous semiconductor memory in response to an external control input on an edge of said external clock signal;*

*wherein said control means comprises a random state machine.*

*72. The memory of claim 71, wherein said random state machine determines a new state based on said external control input and a current state, and outputs said internal control signal based on said new state in response to an edge of said external clock signal.*

*73. The memory of claim 72, wherein said random state machine comprises:*

*decoding means for decoding said new state so as to output said internal control signal.*

*74. The memory of claim 72, wherein said current state and said new state may be any one of a first state indicating an initial state and a plurality of second states each indicating a state other than said initial state, and with respect to at least one of the plurality of second states when said current state is said at least one second state, said new state may be any one of a predefined plurality of second states from among said plurality of second states, each of said predefined plurality of second states indicating states other than said initial state.*

*75. A synchronous dynamic random access memory integrated circuit comprising:*

*a memory block including a plurality of memory cells for storing information;*

*an input for receiving an external clock signal;*

*an address input means for receiving a first address and a second address, said address input means providing said first address as an output in response to a first edge of said external clock signal, said address input means providing said second address as an output in response to a second edge of said external clock signal, said first edge of said external clock signal being different from said second edge of said external clock signal;*

*access means for accessing a location in said memory block corresponding to said first address and said second address provided by said address input means; and*

*control means for receiving a predetermined set of control signals provided from outside of said synchronous dynamic random access memory, for making a transition from a state to a next state in accordance with said predetermined set of control signals on respective edges of said external clock signal, and for outputting an internal control signal defining a timing of an internal operation of said synchronous dynamic random access memory based on the said next state;*

*wherein said predetermined set of control signals include a first control signal and a second control signal, said*

*internal operation represents a write operation when said first control signal is in a first logic level and said second control signal is in a second logic level, and said internal operation represents a read operation when said first control signal is in a third logic level which is different from the first logic level and said second control signal in said second logic level.*

*76. The memory of claim 75, wherein a logic level of said first control signal is changed during a period when said second control signal is in said second logic level, and said operation of said synchronous dynamic random access memory is changed between said read operation and said write operation in accordance with said logic level change of said first control signal without reverting back to a state prior to starting either said read operation or said write operation.*

* * * * *